United States Patent [19]

Kume et al.

[11] Patent Number: 5,188,976
[45] Date of Patent: Feb. 23, 1993

[54] MANUFACTURING METHOD OF NON-VOLATILE SEMICONDUCTOR MEMORY DEVICE

[75] Inventors: Hitoshi Kume, Musashino; Tetsuo Adachi, Hachioji; Yuzuru Ohji; Tokuo Kure, both of Tokyo; Masahiro Ushiyama, Kokubunji; Hiroshi Kawakami, Hachioji, all of Japan

[73] Assignee: Hitachi, Ltd., Tokyo, Japan

[21] Appl. No.: 727,052

[22] Filed: Jul. 9, 1991

[30] Foreign Application Priority Data

Jul. 13, 1990 [JP] Japan .................. 2-183944
Nov. 2, 1990 [JP] Japan .................. 2-295325

[51] Int. Cl.$^5$ ............................................. H01L 21/70
[52] U.S. Cl. .......................................... 435/52; 437/43; 437/48; 437/195; 437/228
[58] Field of Search ............... 437/43, 48, 49, 50, 437/52, 195, 228, 233, 235, 238; 357/235

[56] References Cited

U.S. PATENT DOCUMENTS

| | | | |
|---|---|---|---|
| 4,426,764 | 1/1984 | Kosa et al. ........................ | 437/43 |
| 4,635,347 | 1/1987 | Lien et al. ........................ | 437/43 |
| 4,646,425 | 3/1987 | Owens et al. ..................... | 437/43 |
| 4,698,787 | 10/1987 | Mukherjee et al. ............ | 357/23.5 |
| 4,719,184 | 1/1988 | Cantarelli et al. .............. | 437/52 |
| 4,764,479 | 8/1988 | Kosa et al. ....................... | 437/52 |
| 4,766,088 | 8/1988 | Kono et al. ...................... | 437/43 |
| 4,780,431 | 10/1988 | Magioni et al. ................. | 437/43 |
| 5,013,674 | 5/1991 | Bergemont ...................... | 437/43 |
| 5,036,018 | 7/1991 | Mazzali et al. .................. | 437/52 |

FOREIGN PATENT DOCUMENTS

| | | | |
|---|---|---|---|
| 0093331 | 7/1981 | Japan ............................... | 437/43 |
| 0017662 | 2/1983 | Japan ............................... | 437/52 |
| 0184768 | 10/1983 | Japan ............................... | 437/43 |
| 145666 | 8/1985 | Japan . | |
| 167377 | 8/1985 | Japan . | |
| 167378 | 8/1985 | Japan . | |
| 042171 | 2/1986 | Japan . | |
| 229368 | 10/1986 | Japan . | |
| 0073774 | 4/1987 | Japan ............................... | 437/52 |
| 150781 | 7/1987 | Japan . | |
| 0241177 | 9/1989 | Japan ............................... | 437/43 |

*Primary Examiner*—Tom Thomas
*Attorney, Agent, or Firm*—Antonelli, Terry, Stout & Kraus

[57] ABSTRACT

Before a high permittivity interlayer insulating film of a non-volatile memory having a two-level gate electrode structure, a surface of a substrate in a peripheral circuit MOS area is successively covered with a thermal oxide film and a polycrystalline silicon film. Before the interlayer insulating film is selectively removed on the peripheral circuit MOS area, the surface of the interlayer insulating film of the non-volatile memory is covered with a polycrystalline silicon film. When the interlayer insulating film in the peripheral circuit MOS area is removed, the polycrystalline silicon film as a lower layer in the peripheral circuit area serves as a buffer layer against contamination or damage due to the etching, and the conductive layer on the surface of the interlayer insulating film in the non-volatile memory portion also serves as a buffer layer against the contamination or damage due to the etching.

10 Claims, 16 Drawing Sheets

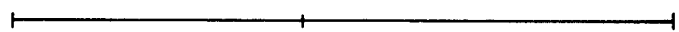
MEMORY TRANSISTOR AREA (FIRST AREA) | PERIPHERAL CIRCUIT MOS TRANSISTOR AREA (SECOND AREA)
FIG. 1A
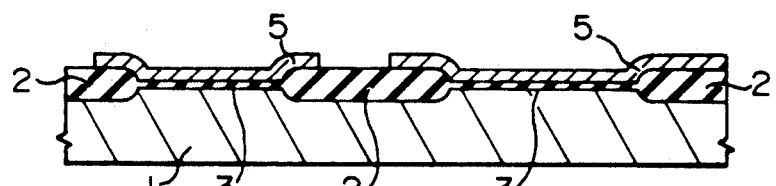
FIG. 1B
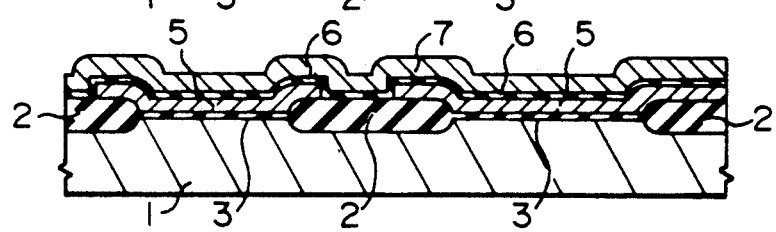
FIG. 1C
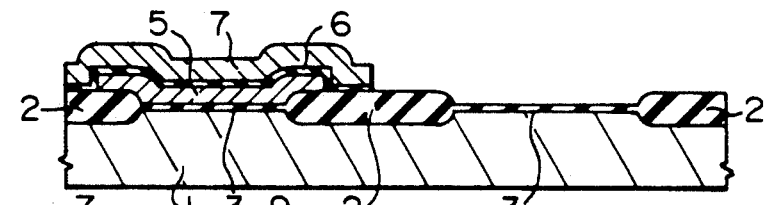
FIG. 1D
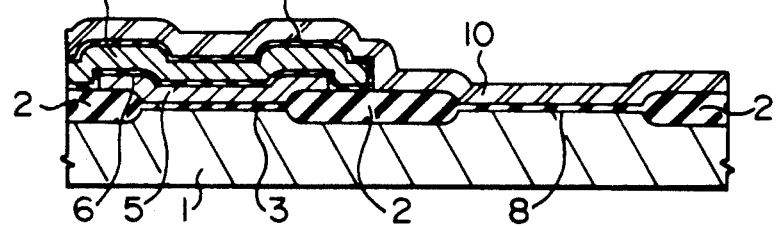
FIG. 1E
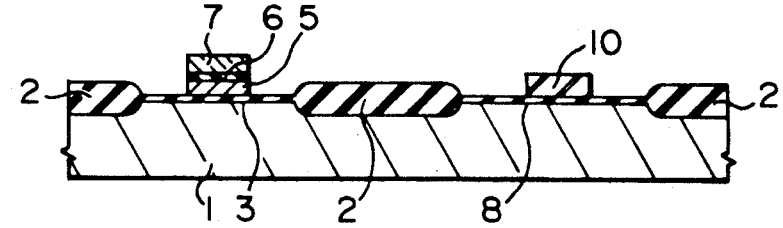

MEMORY TRANSISTOR AREA | PERIPHERAL CIRCUIT MOS TRANSISTOR AREA

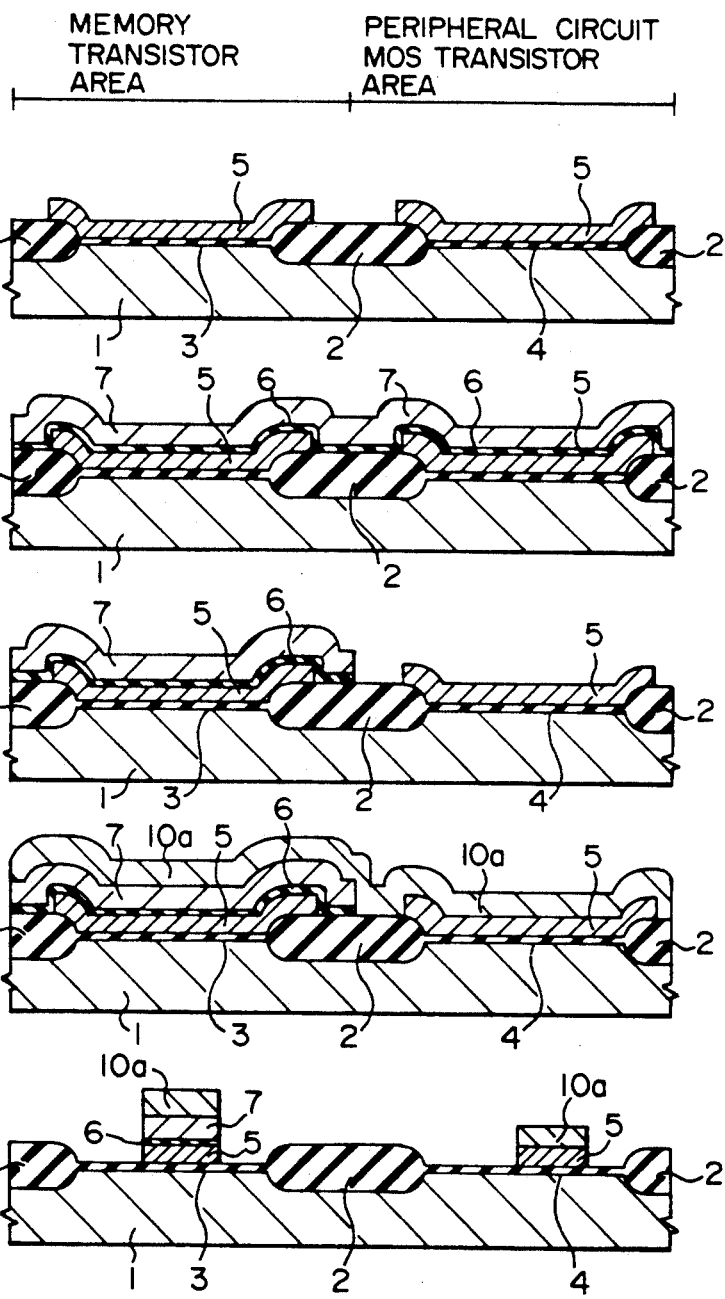

F I G. 16
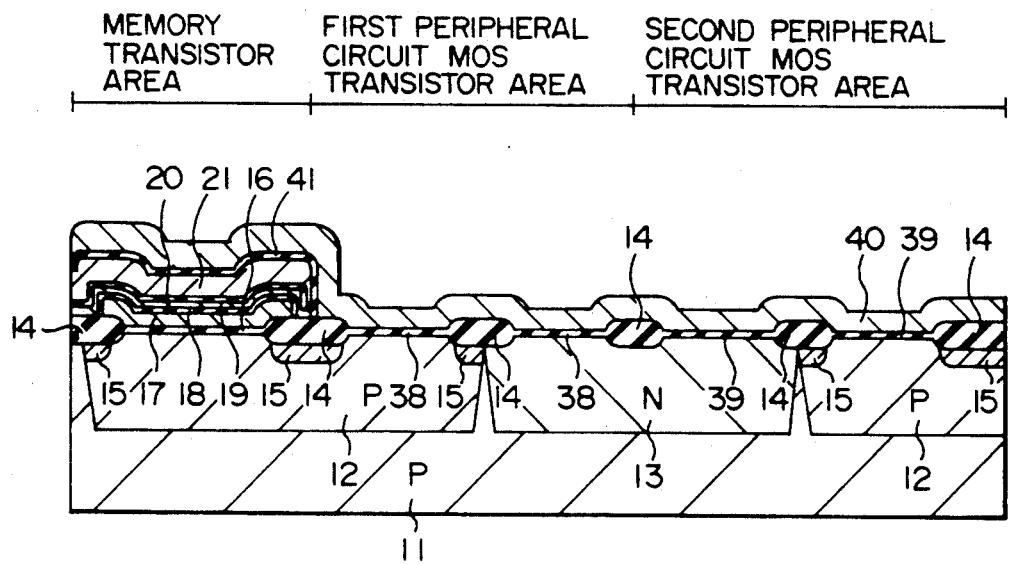
F I G. 17
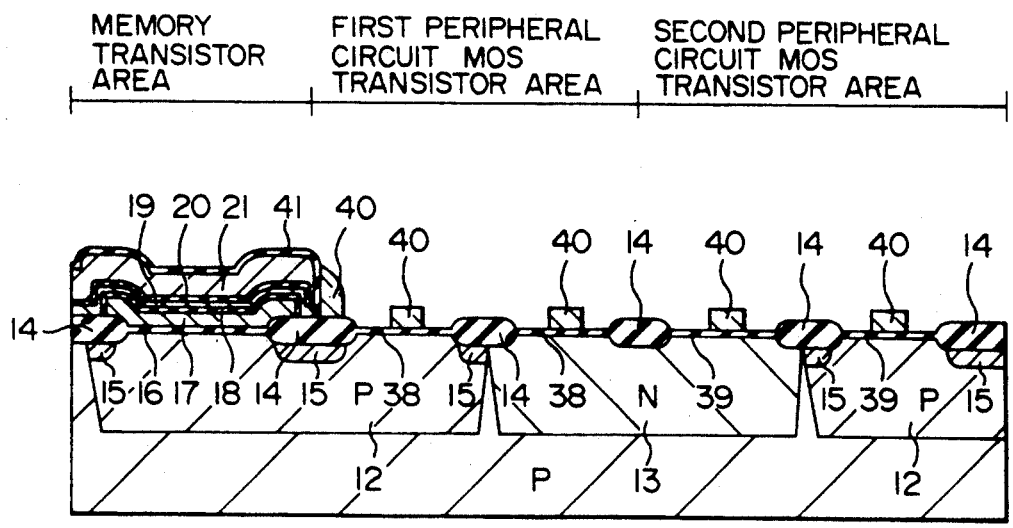

MANUFACTURING METHOD OF NON-VOLATILE SEMICONDUCTOR MEMORY DEVICE

BACKGROUND OF THE INVENTION

1. Field of the Invention

The present invention relates to a manufacturing method of a non-volatile semiconductor memory device and more particularly to a non-volatile semiconductor memory device manufacturing method for forming a non-volatile memory transistor of a two-level gate electrode structure made up of a floating gate electrode and a control gate electrode, and a MOS transistor of a single gate electrode structure for a peripheral circuit, on a single semiconductor substrate.

2. Description of the Related Art

In a non-volatile memory transistor of a two-level gate electrode structure made up of a floating gate electrode and a control gate electrode, one important point for realizing excellent performance is to provide a large capacitive coupling between the control gate and the floating gate.

As an interlayer insulating film between the control gate and the floating gate, a thermal oxide film of polysilicon forming the floating gate electrode has been widely used. However, in order to increase the capacitive coupling without sacrificing the area of a memory cell, it becomes necessary to thin the thermal oxide film. But, the polysilicon oxide film causes a current to more readily flow therethrough as compared with the thermal oxide film of a single crystalline silicon and has a low breakdown voltage, and therefore, it is difficult to form a thin polysilicon oxide film.

On the other hand, if an interlayer insulating film can be made of a material having a permittivity higher than that of an oxide film, it is possible to increase the capacitive coupling without forming a thin oxide film. Therefore, in JP-A-60-145666 (laid open on Aug. 1, 1985) or JP-A-61-229368 (laid open on Oct. 13, 1986), there is disclosed a non-volatile memory device in which an interlayer insulating film is formed by a two layer film made up of a thin silicon oxide film and a silicon nitride film of a high permittivity on the basis of the above conception. Further, in JP-B-2-2310 (published on Jan. 17, 1990 and corresponding to JP-A-60-167377 laid open on Aug. 30, 1985) and JP-B-2-2311 (published on Jan. 17, 1990 and corresponding to JP-A-60-167378 laid open on Aug. 30, 1985), there is disclosed a non-volatile memory device and a method of manufacturing the same in which thin silicon oxide films are provided on the upper and lower sides of a silicon nitride film to form an interlayer insulating film.

A method employing a high permittivity material for an interlayer insulating film in such a manner is also advantageous in the respect of a low temperature manufacturing process. In the case where the thermal oxide film of the polysilicon is used for the interlayer insulating film, the oxidation at high temperature from 1000° C. to 1150° C. or so is necessary to limit a leakage current to a tolerance of a data retention characteristic. On the other hand, in the above publications, there is shown that if a silicon nitride film by the chemical vapor deposition method (CVD method) is used, the temperature of the process including the formation of a thin film silicon oxide film can be lowered to a range of 800° C. to 900° C. or so.

On the other hand, in JP-A-61-421717 (laid open on Feb. 28, 1986) and JP-A-62-150781 (laid open on Jul. 4, 1987), there is disclosed a manufacturing method of forming a non-volatile memory transistor employing a polysilicon oxide film as an interlayer insulating film and a MOS transistor of a single gate electrode structure for a peripheral circuit on a single semiconductor substrate.

More specifically, in JP-A-61-42171, there is disclosed a manufacturing method in which two conductive layers (e.g., polysilicon films) are used, a two-level type gate electrode of a memory transistor is formed by first and second level conductive layers and a single gate electrode of a MOS transistor for a peripheral circuit is formed by the second level conductive layer.

Further, in JP-A-62-150781, there is disclosed a manufacturing method in which three conductive layers are used, a two-level type gate electrode of a memory transistor is formed by first and second level conductive layers, and a single gate electrode of a MOS transistor for a peripheral circuit is formed by the second and third level conductive layers.

In order to operate a non-volatile memory transistor of a two-level gate electrode structure as a memory cell of a non-volatile memory device, it is necessary to form the non-volatile memory transistor and the MOS transistor used with a peripheral circuit for driving the former on a single semiconductor substrate.

As already described, with respect to the formation of the interlayer insulating film of the non-volatile memory device by the polysilicon oxide film, the manufacturing method suitable therefor is clarified as a public known art. However, if it is intended to utilize a high permittivity material, such as a silicon nitride film as described in the prior art, in at least part of the interlayer insulating film, the following problems will arise in the combination of the prior art.

That is, when a high permittivity material such as a silicon nitride film is used for the interlayer insulating film, it is natural that the interlayer insulating film and the gate oxide film of the MOS transistor for a peripheral circuit should be formed in different two processes. However, the two processes exert a bad influence on each other, and therefore, it is difficult to maintain the reliability of the interlayer insulating film and the gate oxide film.

More specifically, in the area of the substrate in which the MOS transistor for a peripheral circuit is to be formed, the gate oxidation is carried out after removing the high permittivity film provided as the interlayer insulating film of the memory transistor. However, the contamination or damage of a portion of the substrate which is exposed during the removal of the high permittivity film loweres the reliability of the gate oxide film.

In other words, when the silicon nitride film in the memory transistor area is covered with a photoresist and the silicon nitride film in the peripheral circuit MOS transistor portion is removed by the dry etching technique, the etching rate ratio between the silicon nitride film and the silicon oxide film cannot be sufficiently taken, and therefore, the silicon oxide film under the silicon nitride film in the peripheral circuit MOS transistor portion is also subjected to the dry etching process. As a result, the surface of the silicon substrate under the etched silicon oxide film is damaged, or heavy metal and the like from the dry etching system are introduced into the surface of the silicon substrate thereunder to contaminate that surface.

Moreover, since the interlayer insulating film in the memory transistor area is also covered with the photoresist film during the process of removing the silicon nitride film, or is subjected to the pre-washing process prior to the formation of the gate oxide film in the peripheral circuit area, a leakage current is increased in a low electric field and it is difficult to maintain a sufficient breakdown voltage.

On the other hand, in JP-A-2-84776 (laid open on Mar. 26, 1990), for the purpose of overcoming the plasma damage due to the dry etching for the gate insulating film in the peripheral circuit MOS transistor portion and the interlayer insulating film of a two-level gate electrode structure in the memory transistor portion, there is disclosed a manufacturing method of a non-volatile semiconductor memory device as will hereinbelow be described.

According to this method, after a silicon nitride film is further formed on the interlayer insulating films of three layers made up of a silicon oxide film, a silicon nitride film and a silicon oxide film each serving as an interlayer insulating film for a two-level gate electrode structure in a memory transistor portion of the non-volatile semiconductor memory device, four layers made up of the silicon nitride film, the silicon oxide film, the silicon nitride film and the silicon oxide film in the peripheral circuit MOS transistor portion are etched in this order with a photoresist pattern being partially left in the memory cell portion, and the photoresist pattern is removed by the asher treatment with some silicon oxide film of the lowest layer being left on the substrate, whereby the three layers of the silicon oxide film, the silicon nitride film and the silicon oxide film are covered with the uppermost silicon nitride film and the surface of the silicon substrate in the peripheral circuit MOS transistor portion is covered with the silicon oxide film of the lowest layer to prevent the influence of the plasma asher.

SUMMARY OF THE INVENTION

However, as the result of the investigation by the present inventors, it is found that the manufacturing method as disclosed in JP-A-2-84776 further includes therein the following problem.

That is, this problem is such that when the four level silicon nitride film in the memory transistor portion is removed by the wet etching using a hot phosphoric acid, the three interlayer insulating films made up of the silicon oxide film, the silicon nitride film and the silicon oxide film in the memory transistor portion, and the silicon oxide film of the lowest layer in the peripheral circuit MOS transistor portion are damaged by the hot phosphoric acid, so that the non-volatile semiconductor memory device cannot be improved.

Therefore, the present invention is made by developing a non-volatile semiconductor memory device provided with a non-volatile memory transistor of a two-level gate electrode structure and a MOS transistor for a peripheral circuit for driving the memory transistor, on the basis of the result of the investigation as described above. It is accordingly an object of the present invention to provide a manufacturing method of a non-volatile semiconductor memory device in which in the case where a high permittivity film member other than a silicon oxide film is used for at least part of interlayer insulating films of a memory transistor, it is possible to maintain the reliability of a gate oxide film of a MOS transistor for a peripheral circuit at a high level.

Moreover, it is another object of the present invention to provide a manufacturing method of a non-volatile semiconductor memory device which is capable of maintaining the reliability of the interlayer insulating films of a non-volatile memory device of a two-level gate electrode structure at a high level.

The foregoing objects can be attained by the following methods according to aspects of the present invention.

In a first method, prior to the formation of a high permittivity interlayer insulating film (6) of a non-volatile memory transistor having a two-level gate electrode structure (5, 7), an area of a substrate in which a MOS transistor for a peripheral circuit is to be formed is successively covered with a thermal oxide film (3) of the substrate and a conductive film (e.g., a polycrystalline silicon film) formed by the chemical vapor deposition method (refer to FIG. 1).

Moreover, in a second method, before an insulating film (6), which is simultaneously formed together with the high permittivity interlayer insulating film (6) of the non-volatile memory transistor having the two-level gate electrode structure (5, 7), is selectively removed on the area of the MOS transistor for a peripheral circuit, the surface of the high permittivity interlayer insulating film (6) of the non-volatile memory transistor is covered with a conductive film (e.g., a polycrystalline silicon film) (7) which will finally constitute at least part of a control gate electrode of the non-volatile memory transistor of a two-level gate electrode structure (refer to FIG. 1).

According to the first method, when removing the interlayer insulating film (6) in the peripheral circuit MOS transistor area, the conductive film (5) as a lower layer of the peripheral circuit MOS transistor area serves as a buffer layer against the contamination or damage due to the etching. Moreover, even when the conductive film (5) needs to be removed, it is possible to set a sufficient large etch selectivity between the conductive film (5) and the thermal oxide film (3) formed thereunder in a normal case, and therefore, the semiconductor substrate in the peripheral circuit MOS transistor area is not exposed to be contaminated or damaged. In such a manner, it is possible to improve the reliability of the gate oxide film of the peripheral circuit MOS transistor area, thus attaining the original objects.

According to the second method, since the surface of the interlayer insulating film (6) in the non-volatile memory transistor portion is covered with the conductive film (7) formed thereon, it is possible to prevent the interlayer insulating film (6) either from being subjected to direct application of a photoresist or an atmosphere of an asher removal, or from being influenced by a pre-washing in the subsequent thermal oxidation process (the process of forming of a gate oxide film (8) in the peripheral circuit MOS transistor area). As a result, a leakage current in a low electric field and a breakdown voltage of the interlayer insulating film (6) are remarkably improved so that the original objects can be attained.

Other features and objects of the present invention will be apparent from the following detailed description of preferred embodiments.

BRIEF DESCRIPTION OF THE DRAWINGS

FIGS. 1A to 1E, FIGS. 2A to 2D and FIGS. 3A to 3E are cross sectional views each showing steps of a manufacturing method of a non-volatile semiconductor memory device according to a basic embodiment of the present invention.

FIG. 14 through FIG. 18, FIG. 19 through FIG. 22, and FIG. 23 through FIG. 28 are cross sectional views each showing steps of a manufacturing method of a non-volatile semiconductor memory device according to another specific embodiment of the present invention.

DESCRIPTION OF THE PREFERRED EMBODIMENTS

Figure 2A:
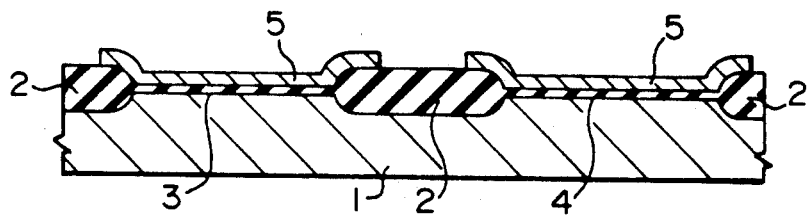

FIGS. 1A through 1E are cross sectional views showing steps of a manufacturing process utilizing deposition conductive films of three layers, as one example suitable for a manufacturing process in which the above-mentioned two methods are combined.

An area on a semiconductor substrate in which a non-volatile memory transistor is to be formed, and an area on the semiconductor substrate in which a MOS transistor for a peripheral circuit is to be formed will hereinafter be referred to as a first area and a second area, respectively, for brevity.

The detailed description will hereinbelow be given with respect to a manufacturing process according to an embodiment shown in FIG. 1.

In FIG. 1A: After a field oxide film 2 for isolation and a gate oxide film 3 for a memory transistor are formed on a semiconductor substrate 1, a first conductive film 5 formed of a polycrystalline silicon film is deposited thereon. This conductive film 5 is to form a floating gate electrode of the memory transistor in the first area, and to form a protective film for protecting the surface of the semiconductor substrate in the second area as will be described later.

Thus, prior to the subsequent formation of an interlayer insulating film 6, the conductive film 5 covering the surface of the semiconductor substrate in the second area can be formed of the conductive film in the same layer as that of the floating gate electrode 5.

In FIG. 1B: After the interlayer insulating film 6 having a permittivity higher than that of the gate oxide film 3 is formed, a second conductive film 7 (polycrystalline silicon film) to be a control gate electrode of the memory transistor is formed on the interlayer insulating film 6.

In FIG. 1C: The second conductive film 7, the interlayer insulating film 6 and the first conductive film 5 on the second area are removed in this order using the lithography technique.

When the interlayer insulating film 6 is removed in the second area by the etching, the polycrystalline silicon film 5 formed thereunder serves as a buffer layer for preventing the surface of the semiconductor substrate in the second area from being contaminated or damaged.

Moreover, when the interlayer insulating film 6 is removed in the second area by the etching, the uppermost polycrystalline silicon film 7 in the memory cell portion serves as a buffer layer for preventing the interlayer insulating film 6 in the first area from being influenced by the direct application of a photoresist, the asher atmosphere and the pre-washing.

Incidentally, when the first conductive film 5 is etched, it is preferable to prevent the surface of the semiconductor substrate 1 from being exposed by taking a suitable etch selectivity between the first conductive film 5 and the gate oxide film 3 formed thereunder. For example, when the dry etching is used, the etch selectivity between the polycrystalline silicon film 5 and the silicon oxide film 3 becomes 50:1. When the wet etching is used, the etch selectivity therebetween becomes larger. Thus, it is possible to prevent the exposure of the surface of the semiconductor substrate 1.

In FIG. 1D: After the surface of the semiconductor substrate in the second area is again thermally oxidized to form a gate oxide film 8 for a MOS transistor for a peripheral circuit, a third conductive film 10 (polycrystalline silicon film) is subsequently formed.

In FIG. 1E: In the first area the third conductive film 10 is perfectly removed, and at the same time, in the second area the third conductive film 10 is processed to form a single gate electrode for the peripheral circuit MOS transistor. When in the first area the third conductive film 10 is removed, an oxide film 9, which is formed on the second conductive film 7 during the thermal oxidation in the step of FIG. 1D, is used as a stopper. Subsequently, in the first area, the second conductive film 7, the interlayer insulating film 6 and the first conductive film 5 are successively processed to form a two-level gate electrode for the memory transistor. Thereafter, the manufacturing process proceeds to a normal process of forming a source/drain area.

FIGS. 2A through 2D are cross sectional views showing steps of a manufacturing process utilizing deposition conductive films of two layers, as another example suitable for a manufacturing process in which the above-mentioned two methods are combined.

In FIG. 2A: After a field oxide film 2 for isolation, a gate oxide film 3 for a memory transistor and a gate oxide film 4 for a MOS transistor for a peripheral circuit are formed on a semiconductor substrate 1, a first conductive film 5 is deposited.

This conductive film 5 is to form a floating gate electrode of the memory transistor in the first area, and to form a protective film for protecting the surface of the semiconductor substrate in the second area as will be described later.

Thus, prior to the subsequent formation of an interlayer insulating film 6, the conductive film 5 for covering the surface of the semiconductor substrate in the second area can be formed of the conductive film in the same layer as that of the floating gate electrode 5.

Figure 2B:
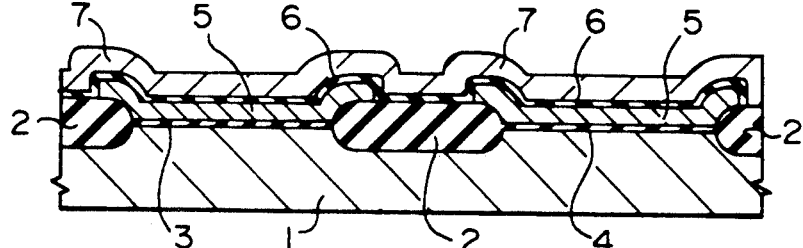

In FIG. 2B: After the interlayer insulating film 6 is formed, a second conductive film 7 to be a control gate electrode of the memory transistor is subsequently formed on the interlayer insulating film 6.

Figure 2C:
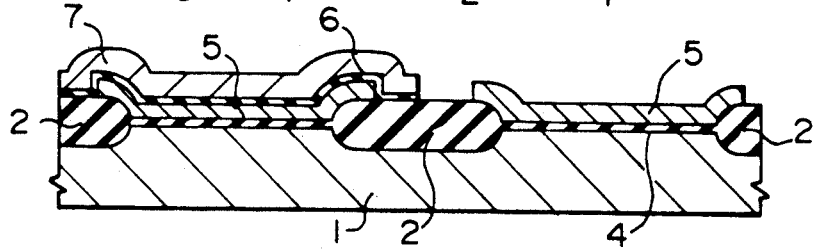

In FIG. 2C: The second conductive film 7 and the interlayer insulating film 6 on the second area are successively removed using the lithography technique.

Figure 2D:
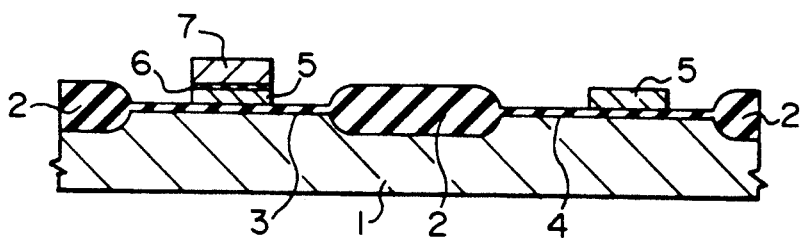

In FIG. 2D: In the first area the second conductive film 7, the interlayer insulating film 6 and the first conductive film 5 are successively processed to form a two-level gate electrode of the memory transistor, and in the second area the first conductive film 5 is processed to form a gate electrode of the peripheral circuit MOS transistor. Thereafter, the manufacturing process proceeds to a normal process of forming a source/drain area.

FIGS. 3A through 3E are cross sectional views showing steps of a manufacturing process including therein steps of reducing a resistance of a gate electrode material added to the steps of the manufacturing process shown in FIG. 2, as still another example suitable for a manufacturing process in which the above-mentioned two methods are combined.

The steps of a manufacturing process shown in FIG. 3A, FIG. 3B and FIG. 3C are completely the same as those shown in FIG. 2A, FIG. 2B and FIG. 2C, respectively. Thereafter, the following steps are added.

In FIG. 3D: A third level conductive film 10a (e.g., a conductive film, such as a metal silicide film, having a resistance lower than that of a polycrystalline silicon film) to be electrically integrated with the first and second level conductive films 5, 7 is formed on the whole surface of the substrate body.

In FIG. 3E: The third level conductive film 10a and the first level conductive film 5 are processed to form a gate electrode of the peripheral circuit MOS transistor, and subsequently, the third level conductive film 10a, the second level conductive film 7, the interlayer insulating film 6 and the first level conductive film 5 are subjected to the stack cutting process to form a two-level gate electrode of a non-volatile memory transistor. Thereafter, the manufacturing process proceeds to a normal process of forming a source/drain area.

Figure 4:
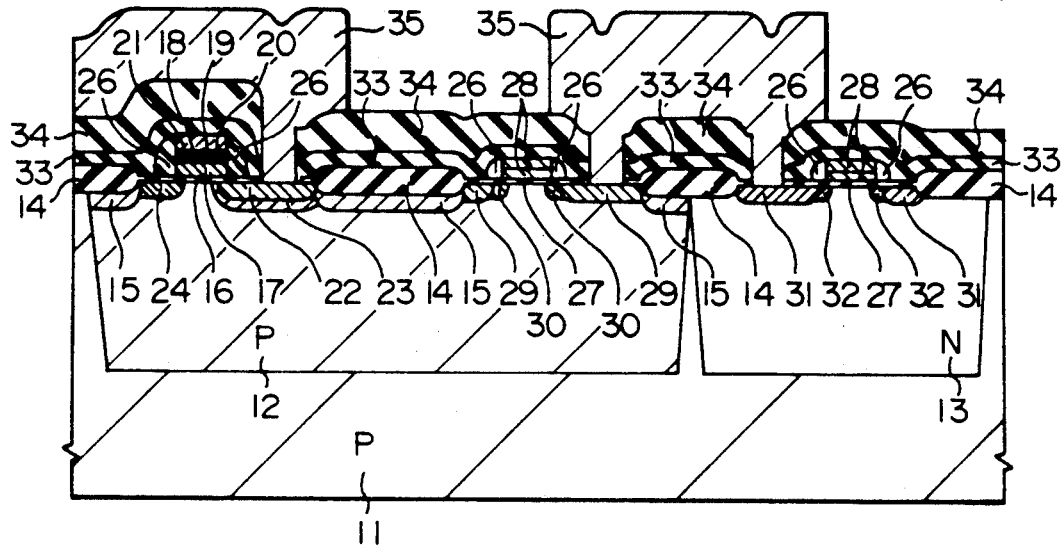
FIG. 4 is a cross sectional view showing a non-volatile semiconductor memory device which is formed according to a specific embodiment of the present invention.

FIG. 4 is a cross sectional view showing an integrated circuit device including a non-volatile memory transistor and MOS transistors for a peripheral circuit which are formed on the same semiconductor substrate by a manufacturing method as will be described in the present embodiment.

The integrated circuit device sown in FIG. 4 is formed on a semiconductor substrate 11 made of a single crystalline p type silicon. However, the semiconductor substrate 11 is not especially limited thereto or thereby. An n-channel MOS transistor is made up of n type source and drain regions 29, 30 which are formed on the surface of a p type well region 12 having the same conductivity type as that of such a semiconductor substrate 11, a thin gate oxide film 27 which is formed on a channel between the source region and the drain region, and a gate electrode 28 which is formed of a third conductive film (a tungsten polycide film, i.e., a two layer film of a polysilicon layer and a tungsten silicide layer).

On the other hand, a p-channel MOS transistor is formed in an n type well region 13 having an opposite conductivity type to that of the semiconductor substrate 11. That is, the p-channel MOS transistor is made up of p type source and drain regions 31, 32 which are formed on the surface of the n type well region 13, a thin gate oxide film 27 which is formed on a channel between the source region and the drain region, and a gate electrode 28 which is formed of the third conductive film (the tungsten polycide film, i.e., the two layer film of the polysilicon layer and the tungsten silicide layer).

Each of the n-channel and p-channel MOS transistors employ the so-called LDD (Lightly Doped Drain) structure. However, it is not especially limited thereto or thereby.

A non-volatile memory transistor is formed on the same p type well region 12 as in the n-channel MOS transistor. The non-volatile memory transistor is made up of a gate oxide film (tunnel oxide film) 16, a floating gate electrode 17 formed of the first conductive film (polycrystalline silicon film), an interlayer insulating film formed of a composite film of thin silicon oxide films 18 and 20, and a silicon nitride film 19, a control gate electrode 21 formed of the second conductive film (polycrystalline silicon film), a source region 24 and a drain region 22 which are formed prior to the formation of a side wall spacer 26, and a drain shielding region 23. The floating gate electrode 17, the interlayer insulating film elements 18, 19 and 20, and the control gate electrode 21 are subjected to the stack cutting in the direction of the gate length by one lithography process to realize a two-level gate electrode structure of a stack type.

The gate oxide film 16 is formed of a silicon oxide film which is formed by thermally oxidizing the surface of the semiconductor substrate 11, and has a thickness of 10 nm or so.

As described above, the interlayer insulating film is the composite film of the silicon oxide films and the silicon nitride film. It is formed in such a way that after the thermal oxide film 18 with about 4 nm thickness is formed on the surface of the floating gate electrode 17 formed of polycrystalline silicon, the thermal oxide film 20 with about 4 nm thickness is further formed on the surface of the silicon nitride film 19 with 20 nm thickness which is formed by the chemical vapor deposition method. Its effective oxide thickness is about 18 nm.

The control gate 21 formed of polycrystalline silicon serves to control an electric potential of the floating gate electrode 17 through an electrostatic capacitive coupling among the interlayer insulating films 18, 19 and 20. The end portions of the control gate electrode 21 and the floating gate electrode 17 in the direction of the channel length are, as described above, processed by one lithography process, and as a result, the gate length becomes 1.0 μm or so. Moreover, the control gate electrode 21 is formed integrally with a word line W which will be described later.

The drain region 22 is formed of an n+ type semiconductor region and is connected to a data line D formed of an aluminum wiring 35 through a contact hole.

The drain shielding region 23 is formed of a p+ type semiconductor region so as to surround the drain region 22, so that the setting of a threshold voltage in the thermal equilibrium condition, the improvement in injection efficiency of channel hot electrons in the write operation as will be described later, and the prevention of a punch through are realized.

The source region is formed of an n+ type semiconductor region 24 containing therein arsenic (As) as an impurity and further constitutes a source line SL as will be described later.

Incidentally, the reference numeral 14 designates a field oxide film which is formed by the LOCOS method, the reference numeral 15 designates a channel stopper for preventing the generation of a parasitic channel which is formed of a p+ type semiconductor region, the reference numeral 35 designates an aluminum wring, and the reference numerals 33 and 34 designate interlayer insulating films of two layers for the aluminum wiring 35, respectively.

Contact holes are formed on the drain region of the non-volatile memory transistor, the source and drain regions of the peripheral circuit MOS transistor, and each of gate electrodes (not shown in FIG. 4) on the isolation region, respectively.

Incidentally, on the aluminum wiring 35 are provided a PSG (Phosphosilicate Glass) film which is formed by the chemical vapor deposition method, and a final passivation film which is formed of a plasma silicon nitride film deposited thereon (omitted in FIG. 4).

Figure 5:
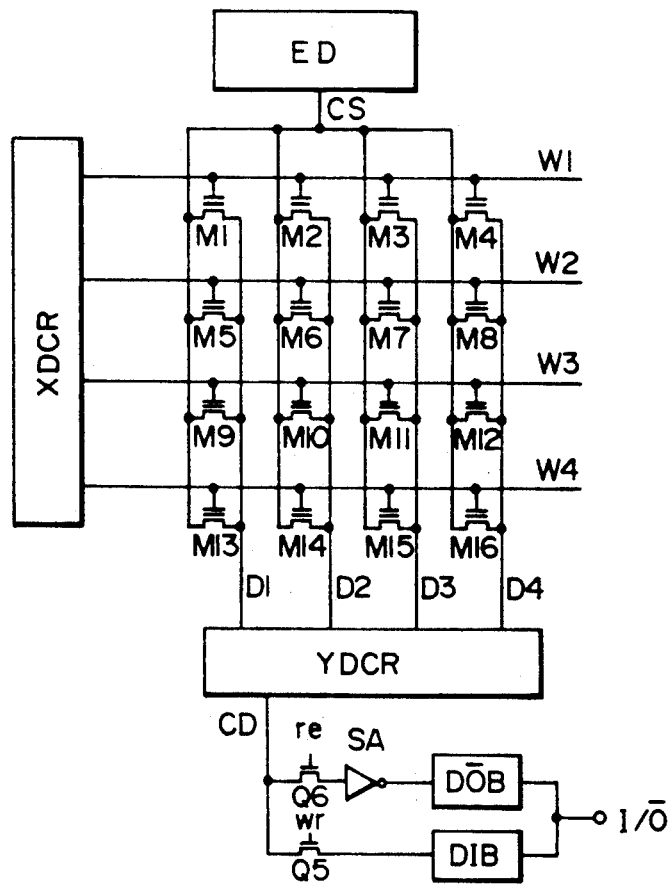
FIG. 5 is an internal block diagram showing the non-volatile semiconductor memory device according to the specific embodiment of the present invention.

FIG. 5 is an internal block diagram showing one example of a electrically erasable and programmable non-volatile semiconductor memory device which is realized by the manufacturing method of the present embodiment.

In a memory array M-ARRAY, one bit is formed by one device of the non-volatile memory transistor structure shown in FIG. 4.

An X decoder (XDCR), a Y decoder (YDCR), a high voltage switching circuit (ED) for applying a high voltage to the source of the non-volatile memory transistor to execute a predetermined erasure, and the like make up the peripheral circuit of the present invention which is constructed by the CMOS structure shown in FIG. 4.

Figure 6:
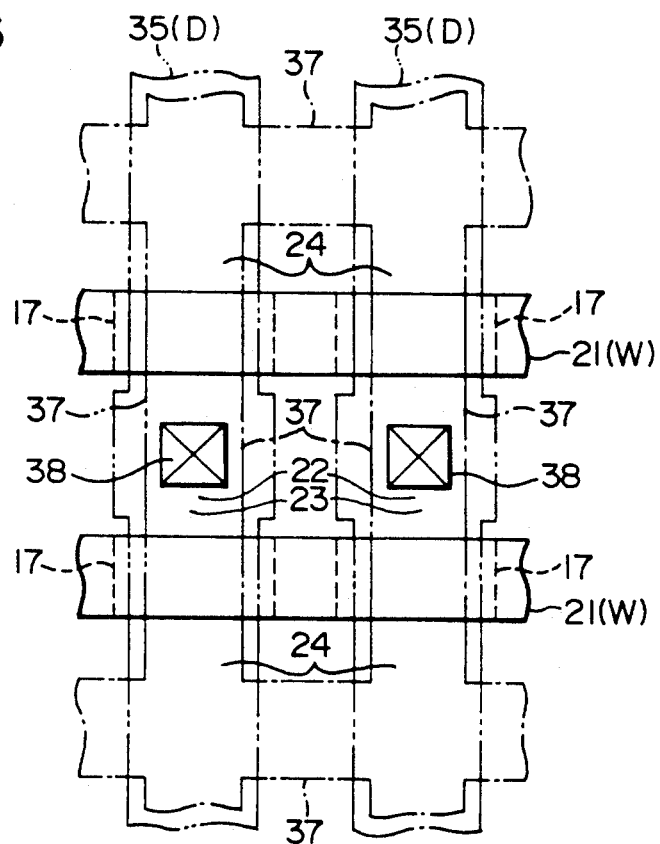
FIG. 6 is a plan view showing a layout of a memory cell array for 4 bits of the non-volatile semiconductor memory device according to the specific embodiment of the present invention.

FIG. 6 is a plan view showing a layout of the memory cell array for 4 bits according to the embodiment of the present invention.

The reference numerals shown in FIG. 6 generally correspond to those shown in FIG. 4. In addition thereto, the reference numeral 37 designates a boundary line between the LOCOS region 14 for isolation and the active region, and the reference numeral 38 designates a contact hole for connecting the data line 35 (D) formed of a metal wiring to the drain region 22 of the memory cell. Moreover, the polysilicon control gate electrode 21 extends in a direction perpendicularly intersecting the metal data line 35 (D) to form the word line.

Since the details of the operation of the non-volatile semiconductor memory device is basically the same as those described in the U.S. Pat. No. 4,698,787 issued on Oct. 6, 1987 to Mukherjee et al, they are omitted herein for brevity.

The flow of the manufacturing process according to this embodiment of the present invention will hereinafter be described in detail with reference to cross sectional views and a plan view of steps of a manufacturing process shown in FIG. 7 through FIG. 18.

Figure 7:
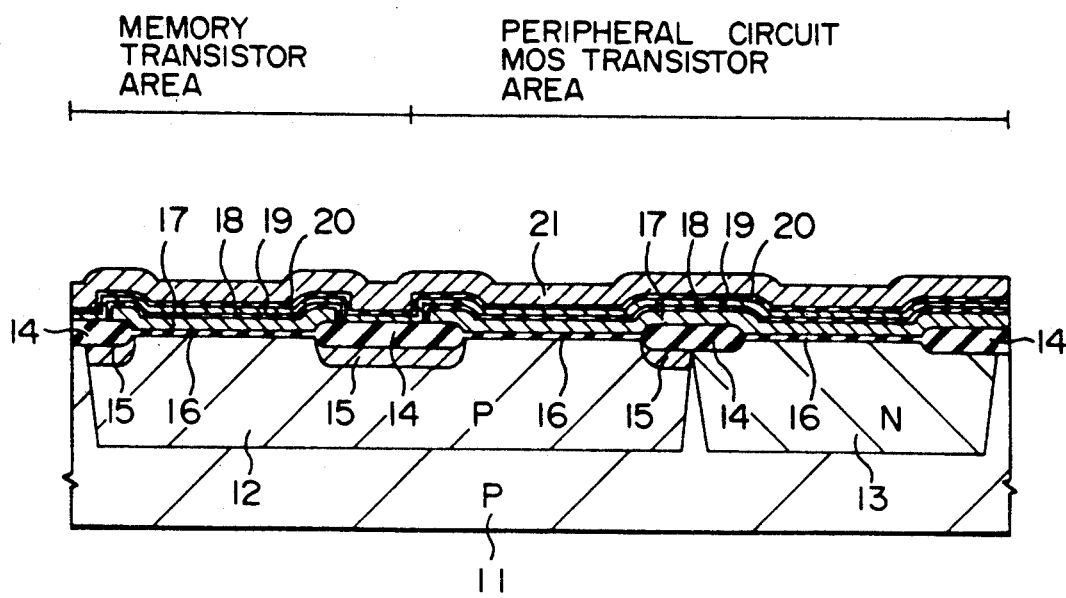
FIG. 7, FIG. 9 through FIG. 13 are cross sectional views showing steps of a manufacturing method of a non-volatile semiconductor memory device according to the specific embodiment of the present invention.
Figure 8:
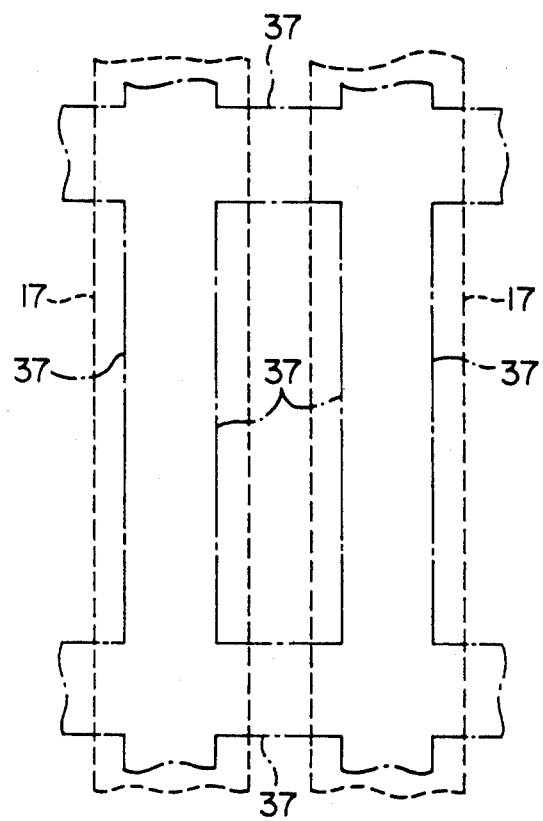
FIG. 8 is a plan view showing a layout of a memory cell array of the non-volatile semiconductor memory device according to the specific embodiment of the present invention.

As shown in FIG. 7, a p type well region 12 and an n type well region 13 are formed on the main surface side of a p type semiconductor substrate 11 by the conventional twin-tub process, and further a field oxide film 14 for isolation and a channel stopper 15 for preventing the generation of a parasitic channel formed of a p+ type semiconductor region are formed by the LOCOS process.

Then, after the surface of an active region is thermally oxidized to form a gate oxide film 16 with 10 nm thickness, a polycrystalline silicon film 17 with 200 nm thickness as a first conductive film is subsequently deposited by the known chemical vapor deposition method. After the polycrystalline silicon film 17 is doped with phosphorus (P) as an n type impurity by the known thermal diffusion method or ion implantation method, as shown in a plan view of FIG. 8, in the memory transistor area, the polycrystalline silicon film 17 processed so as to have a shape suitable for the formation of a final floating gate electrode. At this time, in the peripheral circuit MOS transistor area, there is left the polycrystalline silicon film as it is for usage as a cover.

Subsequently, a composite film of silicon oxide films 18 and 20, and a silicon nitride film 19 which is to be an interlayer insulating film of the memory transistor is formed. More specifically, the surface of the polysilicon film 17 is first thermally oxidized to form a thin oxide film 18 with 4 nm thickness. Then, after the silicon nitride film 19 with 20 nm thickness is formed by the known chemical vapor deposition method, the surface of the film 19 is thermally oxidized to form the silicon oxide film 20 with 4 nm thickness.

On the composite interlayer insulating film of a three layer structure made up of the oxide film 18/the nitride film 19/the oxide film 20 thus formed, a polycrystalline silicon film 21 with 300 nm thickness as a second conductive film is formed. Since the interlayer insulating films 18, 19 and 20 are covered with the polycrystalline silicon film 21 immediately after the formation thereof, and thereafter, they are not exposed. Thus, the reliable interlayer insulating film characteristics can be realized. In the same manner as in the first level polycrystalline silicon film, the polycrystalline silicon film 21 is doped with phosphorus (P) as an n type impurity by the known thermal diffusion method or ion implantation method.

Figure 9:
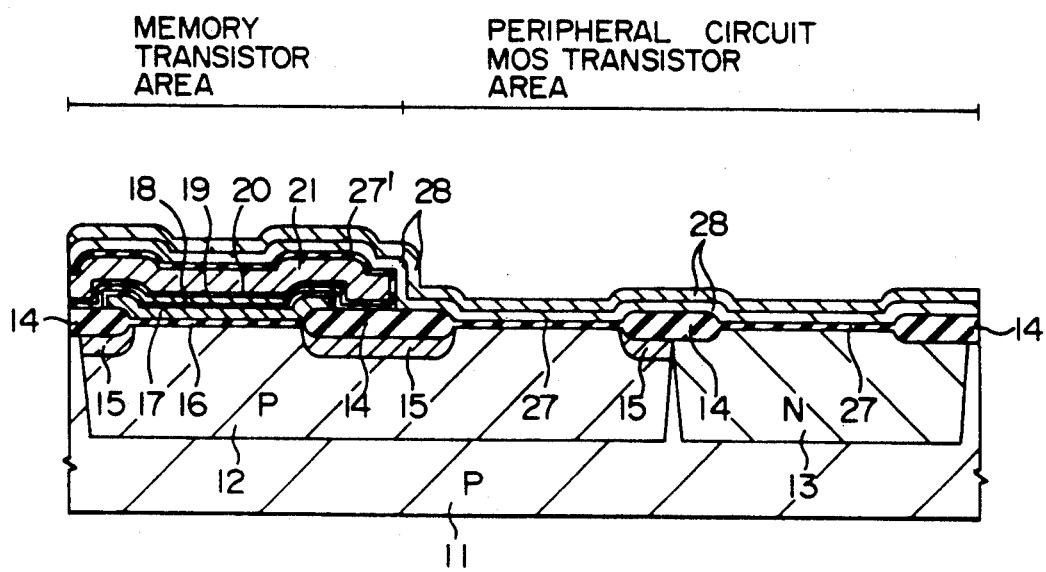

Next, as shown in FIG. 9, the second level polycrystalline silicon film 21, the interlayer insulating films 20, 19 and 18, and the first level polycrystalline silicon film 17 which are formed on the peripheral circuit MOS transistor area are successively removed by the known dry etching technique.

When in the peripheral circuit MOS transistor area the interlayer insulating films 18, 19 and 20 are being etched, the surface of the substrate and the gate oxide film 16 in the peripheral circuit MOS transistor area are completely covered with the first level polycrystalline silicon film 17 (not shown in FIG. 9). Moreover, in the dry etching of the first level polycrystalline silicon film 17, a sufficient large etch selectivity (30 to 50 or so) to the gate oxide film 16 formed thereunder can be realized. Therefore, as already described, there is no possibility that in this series of dry etching processes, the surface of the substrate in the peripheral circuit MOS transistor area is exposed, or influenced by the contamination or damage.

Next, after the surface of the substrate in the peripheral circuit MOS transistor area is washed, a gate oxide film 27 with 18 nm thickness for the peripheral circuit MOS transistor is formed by the thermal oxidation. At this time, an oxide film 27' with about 60 nm thickness is simultaneously formed on the surface of the second level polycrystalline silicon film 21 in the memory transistor portion.

Thereafter, a tungsten polycide film 28 as a third conductive film is formed. The formation procedure of the tungsten polycide film 28 is as follows. First, a polycrystalline silicon film with 150 nm thickness is formed. The polycrystalline silicon film thus formed is then doped with phosphorus (P) of about $5 \times 10^{20}/cm^3$ as an n type impurity by the known thermal diffusion method or ion implantation method. Subsequently, a tungsten silicide film with 150 nm thickness is directly formed on the polycrystalline silicon film by the known chemical vapor deposition method to form the electrically integrated tungsten polycide film 28.

Figure 10:
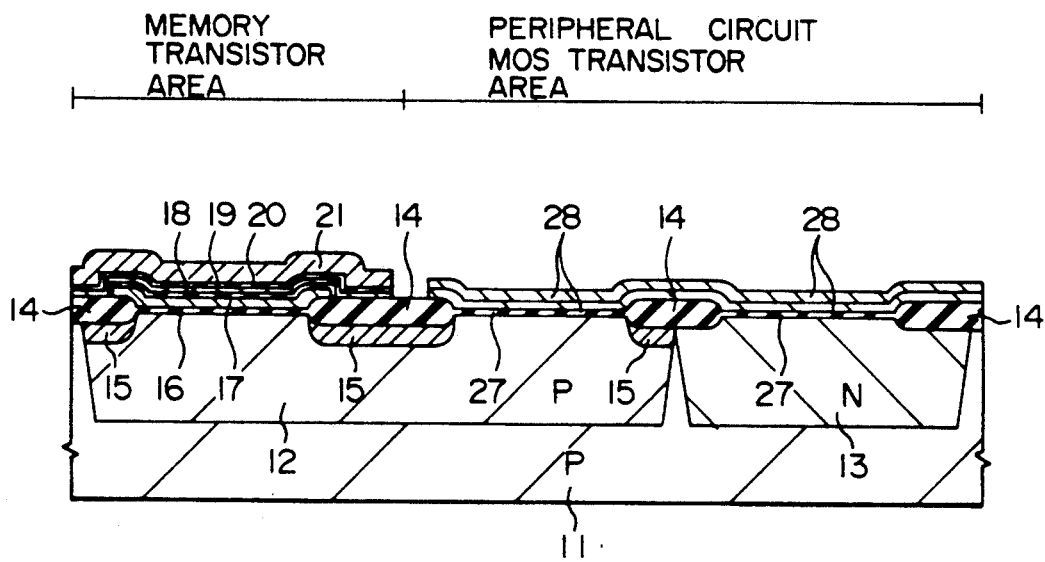

Then, as shown in FIG. 10, the tungsten polycide film 28 as the third conductive film is removed on the memory transistor area. On the other hand, on the peripheral circuit MOS transistor area, there is left the tungsten polycide film 28 as it is. At this time, for the purpose of preventing the etched residue of the tungsten polycide film 28 from being left in the stepped portion of the end of the second level polycrystalline silicon film 21 covering the memory transistor area, this removal process is carried out by utilizing the isotropic dry etching technique. Moreover, since the etching can be stopped by the oxide film 27', there is no bad influence exerted upon the memory transistor area.

Subsequently, the oxide film 27' is removed by the wet etching to perfectly expose the surface of the second level polycrystalline silicon film 21.

Figure 11:
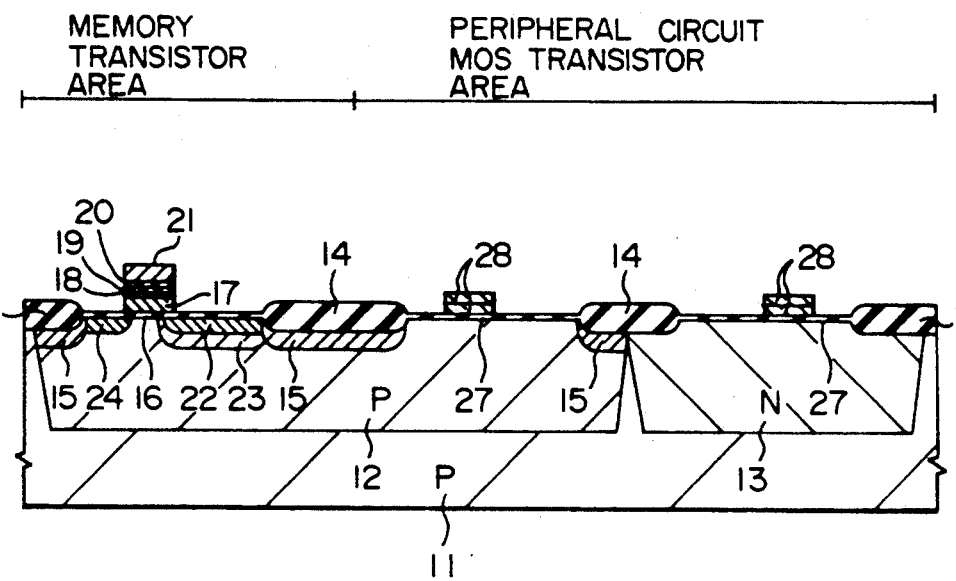

Next, as shown in FIG. 11, the patterning is carried out with respect to the tungsten polycide film 28 as the third conductive film in the peripheral circuit MOS transistor portion by the anisotropic dry etching technique to form a gate electrode 28 of the peripheral circuit MOS transistor. Subsequently, the anisotropic dry etching is performed in the memory transistor portion to form a two-level gate electrode structure of a stack type made up of the second level polycrystalline silicon film 21, the interlayer insulating films of a three layer structure 18, 19 and 20, and the first level polycrystalline silicon film 17. At this time, the two-level gate electrode in the memory transistor portion is obtained through the stack cutting by one lithography process using the anisotropic dry etching technique.

Next, the ion implantation utilizing a photoresist mask and the subsequent thermal annealing process are carried out to form a source region formed of an n+ type semiconductor region 24, a drain region formed of an n+ type semiconductor region 22, and a drain shielding region formed of a p+ type semiconductor region 23.

Thereafter, an n-channel and p-channel MOS transistors of an LDD structure are formed in the peripheral circuit MOS transistor portion by the known CMOS process steps, and the deposition of a non-doped silicon oxide film, the deposition of a silicon oxide film doped with boron/phosphorus, the formation of contact holes, and the formation of a metal wiring made of aluminum are successively performed. Thus, the non-volatile semiconductor memory device made up of the non-volatile memory transistor and the MOS transistors for a peripheral circuit as shown in FIG. 4 is realized.

Figure 12:
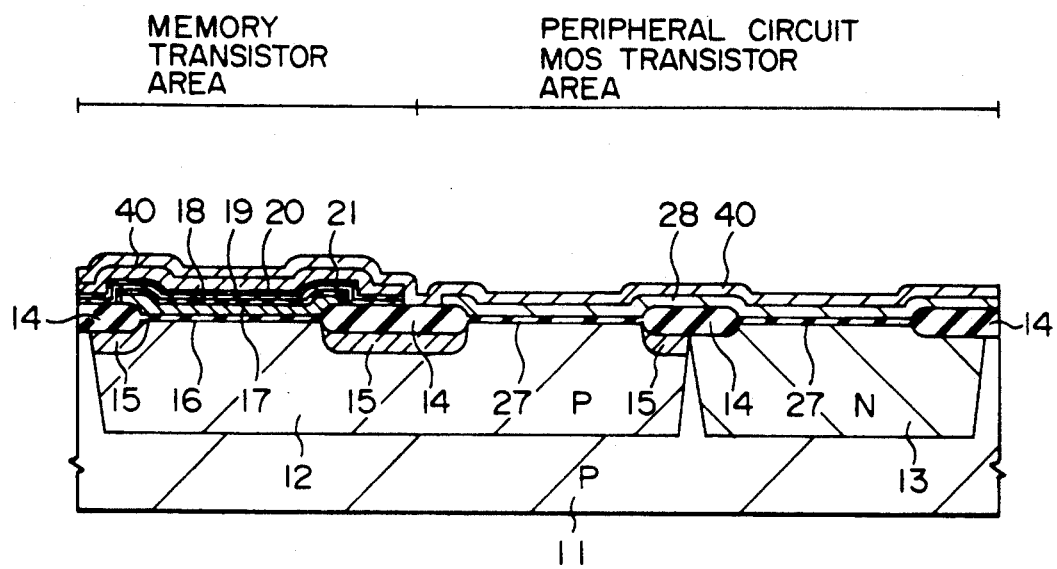
Figure 13:
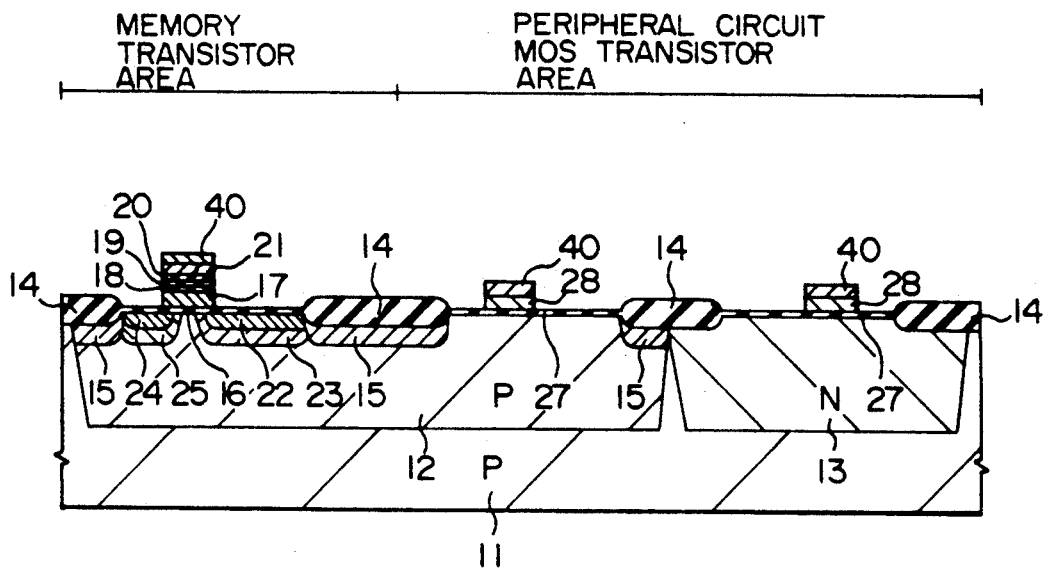

In the non-volatile semiconductor memory device by the above-mentioned manufacturing process, the control gate electrode of the memory transistor constituting the word line of the memory array is formed of polycrystalline silicon. In order to form the control gate electrode of a low resistance wiring such as tungsten polycide in the same manner as in each of the gate electrodes of the MOS transistors for a peripheral circuit, a part of the manufacturing process may be changed as shown in FIG. 12 and FIG. 13. FIG. 12 and FIG. 13 correspond to FIG. 10 and FIG. 11, respectively.

The important modifying points in FIG. 12 are as follows.

(1) The third conductive film 28 is not formed of a tungsten polycide film but a single polycrystalline silicon film with 150 nm thickness.

(2) After the third conductive film 28 is removed from the memory transistor area, the thermal oxide film 27' on the second conductive film 21 is removed and a fourth conductive film 40 is successively formed. The fourth conductive film 40 is a tungsten silicide film formed by the chemical vapor deposition method and has a thickness of 150 nm.

Thereafter, as shown in FIG. 13, the patterning is carried out with respect to the memory transistor portion and the peripheral circuit MOS transistor portion by the anisotropic dry etching to form respective gate electrodes.

According to the above modification, on the memory transistor area, the tungsten silicide film 40 is electrically integrated with the polycrystalline silicon film 21 as the second conductive film, and as a result, a control gate electrode of a tungsten polycide structure can be obtained. Incidentally, it is preferable to thin the polycrystalline silicon film 21 as the second conductive film to a thickness of 150 nm so as not to excessively heighten the two-level gate electrode of the memory transistor. On the other hand, on the peripheral circuit MOS transistor area, the tungsten silicide film 40 is electrically integrated with the polycrystalline silicon film 28 as the third conductive film, and as a result, peripheral circuit MOS transistor gate electrodes of a tungsten polycide structure can be realized.

Moreover, in the non-volatile semiconductor memory device by the above-mentioned manufacturing process, the gate oxide film of each of the peripheral circuit MOS transistors has one type of thickness (18 nm). In order to use the peripheral circuit MOS transistors properly for a high speed operation purpose for reading out and a high voltage drive purpose on the basis of two types of gate electrode thickness (e.g., 18 nm and 35 nm), a part of the manufacturing process may be modified in the following manner.

The description will hereinafter be given with reference to FIG. 14 through FIG. 18.

Figure 14:
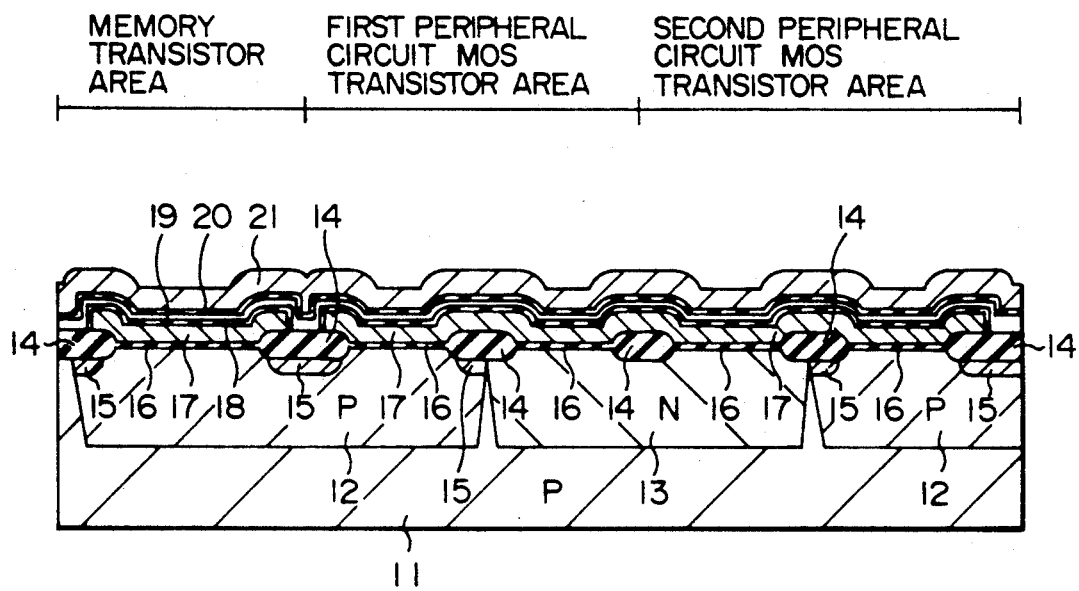

As shown in FIG. 14, a p type well region 12, an n type well region 13, a field oxide film 14 and a channel stopper 15 are formed in the same manner as in the manufacturing process shown in FIG. 7.

Subsequently, after the surface of an active region is thermally oxidized to form a gate oxide film 16 with 10 nm thickness, in the same manner as in the manufacturing process of FIG. 7, a polycrystalline silicon film 17 with 200 nm thickness as a first level conductive film is deposited. Further, in the memory transistor area, the polycrystalline silicon film 17 is processed so as to have a shape suitable for the formation of a floating gate electrode. At this time, in the first and second peripheral circuit MOS transistor areas, there are left the polycrystalline silicon films 17 as they are.

Next, a composite film of silicon oxide films 18 and 20, and a silicon nitride film 19 which are to be interlayer insulating films of the memory transistor, and a second level polycrystalline silicon film 21 are successively formed.

Figure 15:
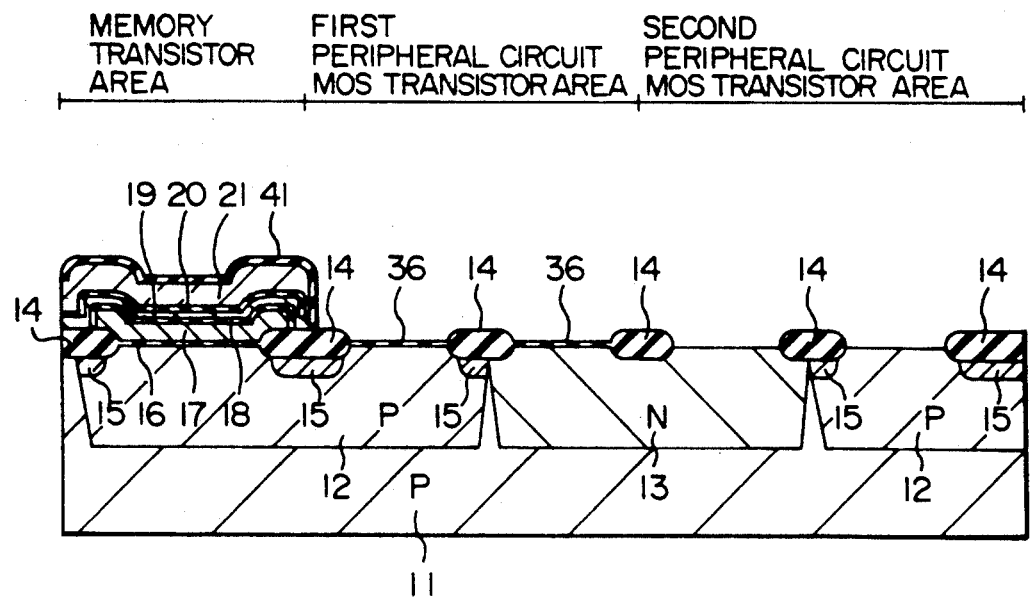

Subsequently, as shown in FIG. 15, the second level polycrystalline silicon film 21, the interlayer insulating films 20, 19 and 18, and the first level polycrystalline silicon film 17, which are formed on each of the peripheral circuit MOS transistor areas, are successively removed by the known dry etching technique, and then the gate oxide film 16 formed thereon is removed by the known wet etching technique.

Thereafter, a thermal oxide film 36 with 28 nm thickness is formed. At this time, an oxide film 41 on the polycrystalline silicon film in the memory transistor area has a thickness of 56 nm or so. Then, the thermal oxide film 36 in the second peripheral circuit MOS transistor area is removed by the wet etching technique.

Further, as shown in FIG. 16, the surface of the active region is again thermally oxidized to form a gate oxide film 39 with 18 nm thickness. At this time, an oxide film 38 in the first peripheral circuit MOS transistor area has a thickness of 35 nm or so, and an oxide film 41 on the polycrystalline silicon film in the memory transistor area has a thickness of 90 nm or so.

Subsequently, after a third level conductive film (a polysilicon film, or a composite film of a metal silicide film such as a tungsten polycide film and a polysilicon film) 40 is formed on the whole surface of the substrate body, the third level conductive layer 40 is selectively etched by the anisotropic etching technique to form gate electrodes in the respective peripheral circuit MOS transistor areas, as shown in FIG. 17.

Then, the third conductive layer 40 is not perfectly etched away to be left in the stepped portion of the boundary between the memory transistor area and the first peripheral circuit MOS transistor area. However, there arises no problem of the short between the lines either by laying out the wiring of the peripheral circuit MOS transistor so as not to cross that stepped portion, or by removing only that portion partially including the memory transistor area by a further etching process.

Figure 18:
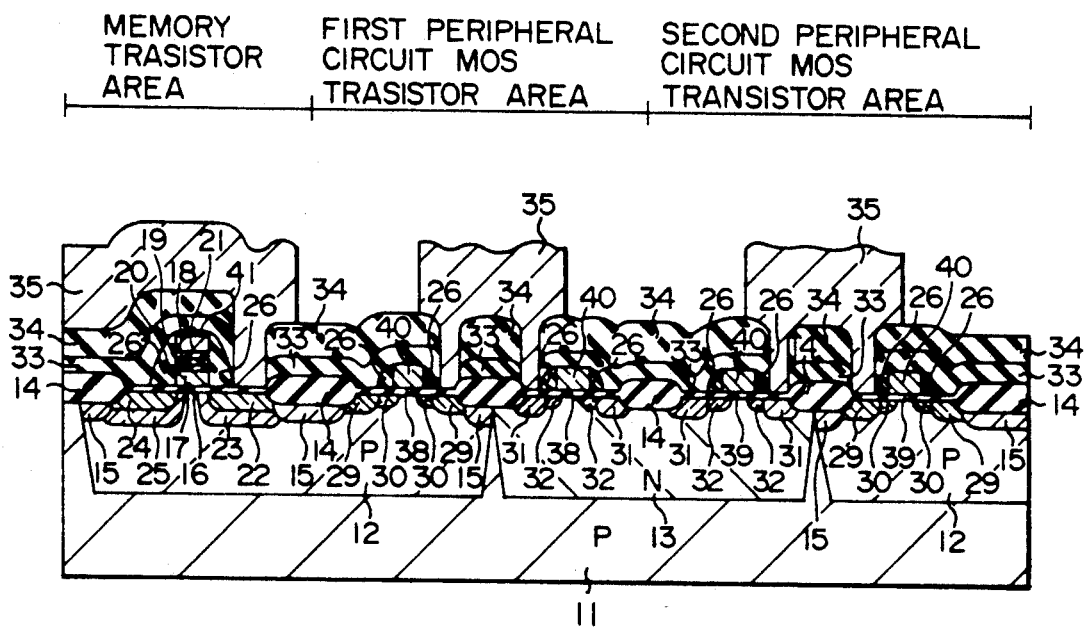

Subsequently, as shown in FIG. 18, a two-level gate electrode of a stack type made up of the oxide film 41, the second level polycrystalline silicon film 21, the interlayer insulating films of a three layer structure 18, 19 and 20, and the first level polycrystalline silicon film 17 on the memory transistor area is formed by the photoetching process.

Thereafter, in the same manner as in FIG. 4, a source region, a drain region, contact holes, and an aluminum wiring are formed, so that a non-volatile semiconductor memory device is realized which is made up of a non-volatile memory transistor, and MOS transistors for a peripheral circuit designed on the basis of the two types of gate electrode size, as shown in FIG. 18.

According to the present embodiment, the following effects can be obtained.

(1) It is possible to integrate a stacked gate type non-volatile memory transistor in which a composite material of a silicon oxide film and a silicon nitride film having a permittivity larger than that of the former is applied to an interlayer insulating film, and MOS transistors used with a peripheral circuit for driving the non-volatile memory transistor, on the same semiconductor substrate by the reliable manufacturing process.

(2) As a result, it is possible to realize a high integration non-volatile semiconductor memory device, which provides excellent performance in write, reading out and erase characteristics, without sacrificing the area of the memory cell and degrading the reliability of the interlayer insulating film and the gate oxide film.

Incidentally, in the present embodiment, the description has been given with respect to the specific case where the composite interlayer insulating film of a three layer structure consisting of the silicon oxide film/the silicon nitride film/the silicon oxide film is used as the interlayer insulating film. However, the present invention is not limited thereto or thereby. That is, even when a two layer structure consisting of a silicon oxide film/a silicon nitride film, or a high permittivity film such as a tantalum oxide film ($Ta_2O_5$) other than the silicon nitride film and its composite film are utilized, the effectiveness of the present invention will not be changed.

Moreover, the present embodiment has been described by taking the electrically erasable and programmable high integration non-volatile semiconductor memory device in which a memory cell can be constructed by one non-volatile memory transistor by way of example. However, the present invention is not limited thereto or thereby. That is, the present invention is effective to the whole non-volatile semiconductor memory devices each of which employs a non-volatile memory transistor having a floating gate electrode, as well as an ultraviolet erasable FAMOS (Floating Gate Avalanche Injection MOS).

The description will hereinbelow be given with respect to a manufacturing method including fewer forming processes of a conductive film as compared with the above-mentioned embodiments on referring to FIG. 19 through FIG. 22.

Figure 19:
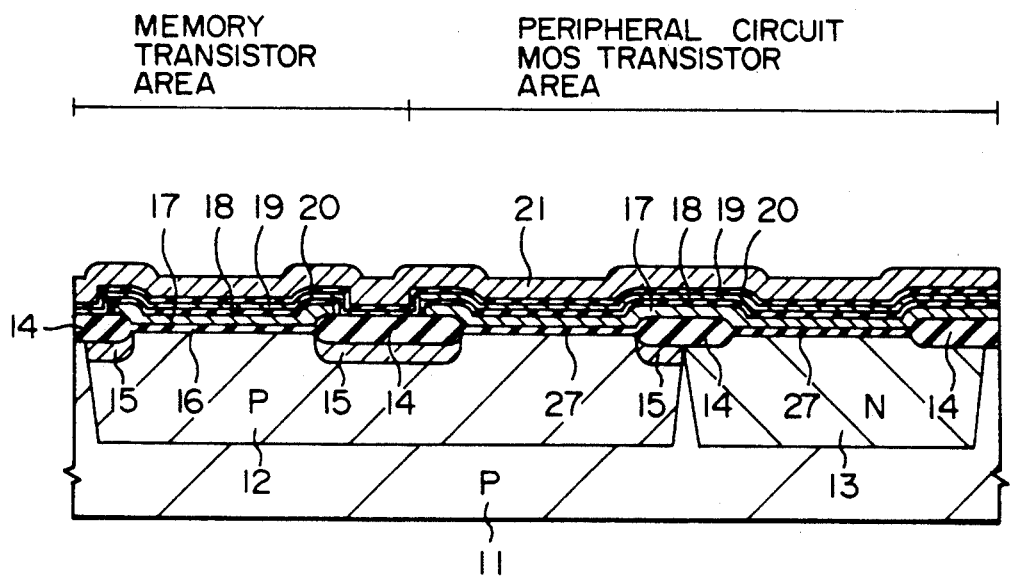
Figure 20:
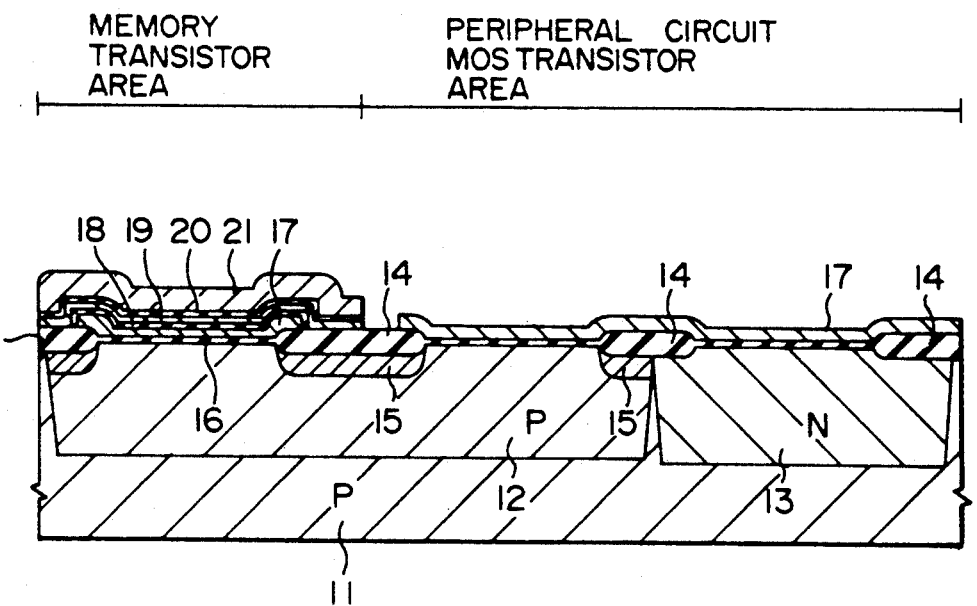
Figure 21:
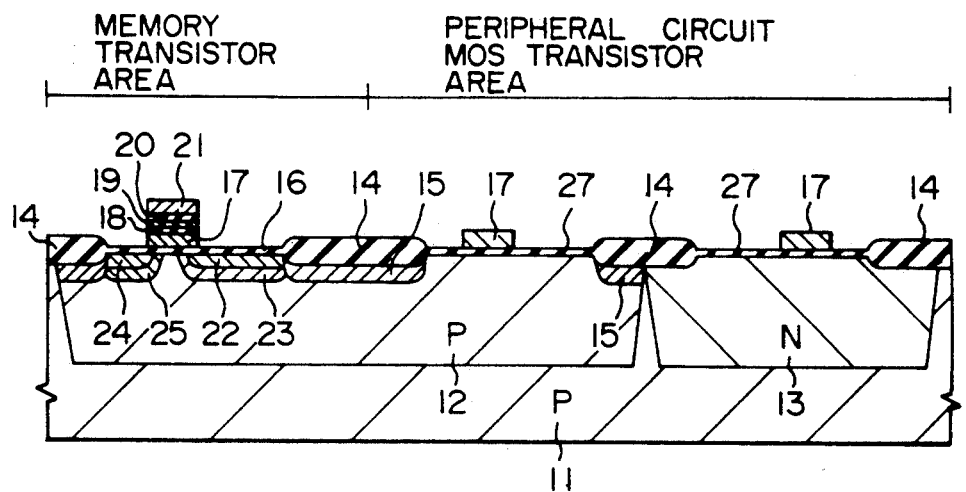
Figure 22:
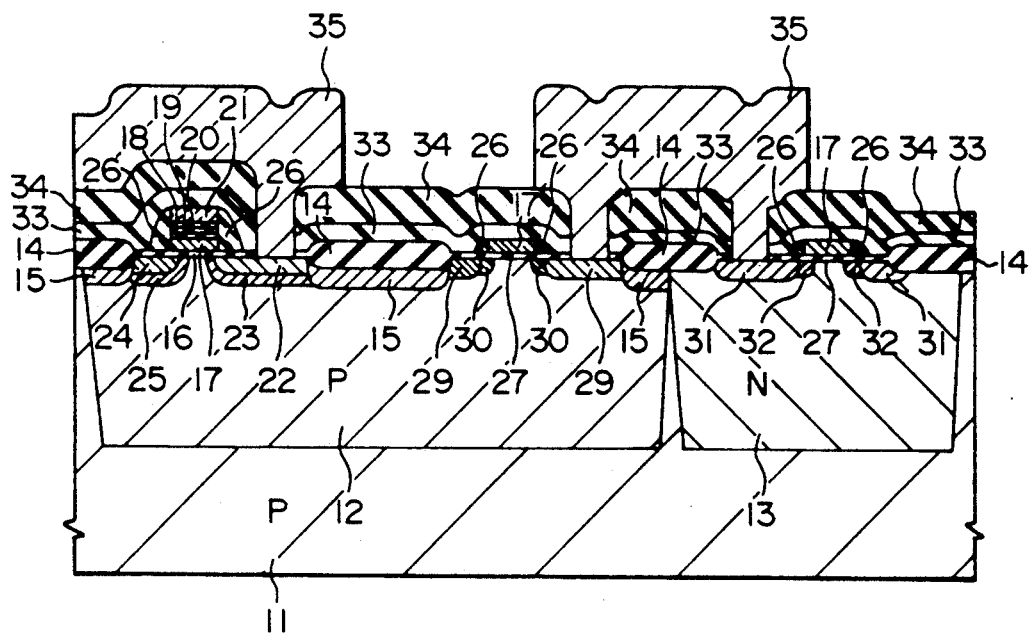

FIG. 22 is a cross sectional view showing an integrated circuit device made up of a non-volatile memory transistor and MOS transistors for a peripheral circuit which are formed on the same semiconductor substrate by a manufacturing method as will be described in the present embodiment. FIG. 19 through FIG. 21 are cross sectional views useful in explaining steps of a manufacturing process according to the present embodiment.

A non-volatile memory transistor and MOS transistors for a peripheral circuit, which are formed on the same semiconductor substrate by the manufacturing method as will be described in the present embodiment on referring to FIG. 19 through FIG. 22, are substantially the same in construction as in each of the embodiments as already described. Therefore, the description thereof is omitted here for brevity.

The flow of the manufacturing process according to the present embodiment will hereinafter be described in detail with reference to FIG. 19 through FIG. 21.

As shown in FIG. 19, a p type well region 12 and an n type well region 13 are formed on the main surface of a p type semiconductor substrate 11 by the conventional twin-tub process for a CMOS, and further, a field oxide film 14 for isolation and a channel stopper 15 for preventing the generation of a parasitic channel formed of a $p^+$ type semiconductor region are formed by the LOCOS process.

Then, after the surface of an active region is thermally oxidized to form a gate oxide film 27 with 15 nm thickness, the thermal oxide film in the memory transistor area is removed by the photoetching process, and the surface of the active region is again thermally oxidized to form a gate oxide film 16 with 10 nm thickness. At this time, the gate oxide film 27 in the peripheral circuit MOS transistor area has a thickness of 18 nm or so.

Subsequently, a polycrystalline silicon film 17 with 200 nm thickness as a first level conductive film is deposited by the known chemical vapor deposition method. After the polycrystalline silicon film is doped with phosphorus (P) as an n type impurity by the known thermal diffusion method or ion implantation method, the polycrystalline silicon film 17 is patterned in the memory transistor area so as to have a shape suitable for the formation of a floating gate electrode. At this time, in the peripheral circuit MOS transistor area, there is left the polycrystalline silicon film 17 as it is.

Next, in the same manner as in the above-mentioned embodiments, a composite film of silicon oxide films 18 and 20, and a silicon nitride film 19 which are to be interlayer insulating films of the memory transistor, and a second level conductive film 21 are successively formed. At this time, the second level conductive film 21 is formed of a polycrystalline silicon film, or a two layer film consisting of a tungsten silicide film and a polycrystalline silicon film.

Thus, since the composite interlayer insulating films 18, 19 and 20 are covered with the polycrystalline silicon film 21 immediately after the formation thereof, and thereafter, they are not exposed, it is possible to realize the reliable interlayer insulating film characteristics.

Next, as shown in FIG. 20, the second level conductive film 21, and the interlayer insulating films 20, 19 and 18 on the peripheral circuit MOS transistor area are successively removed by the known dry etching technique. When the interlayer insulating films 20, 19 and 18 are being etched, the peripheral circuit MOS transistor area is completely covered with the fist level polycrystalline silicon film 17. In this series of dry etching processes, there is not possibility that the surface of the substrate in the peripheral circuit MOS transistor area is contaminated or damaged.

Next, as shown in FIG. 21, the first level polycrystalline silicon film 17 is patterned by the anisotropic dry etching technique to form gate electrodes of the peripheral circuit MOS transistor, and then a two-level gate electrode of a stack type made up of the second level conductive film 21, the interlayer insulating films of a three layer structure 18, 19 and 20, and the first level polycrystalline silicon film 17 is formed. At this time, the two-level gate electrode is obtained through the stack cutting by one lithography process using the anisotropic dry etching technique.

Thereafter, in the same manner as in the above-mentioned embodiments, the forming process of source and drain regions, and the wiring process are carried out. By the above steps of the manufacturing process, the non-volatile semiconductor memory device is realized which is made up of the non-volatile memory transistor and the MOS transistors for a peripheral circuit shown in FIG. 22.

According to the present embodiment, it is possible to realize the non-volatile semiconductor memory device made up of the non-volatile memory transistor and the peripheral circuit MOS transistors using fewer conductive films.

Incidentally, in the present embodiment, as already described, various interlayer insulating films or conductive materials can be used. Moreover, the present invention is effective to the whole non-volatile semiconductor memory devices each of which employs the non-volatile memory transistor having the floating gate electrode.

The detailed description will subsequently be given with respect to a manufacturing method in which two types of gate insulating film size are provided in the peripheral circuit MOS transistors to realize a high breakdown voltage and a high speed operation in the peripheral circuit of the non-volatile semiconductor memory device, on referring to FIG. 23 through FIG. 28.

FIG. 23 through FIG. 28 are cross sectional views useful in explaining steps of a manufacturing process according to the present embodiment.

Figure 28:
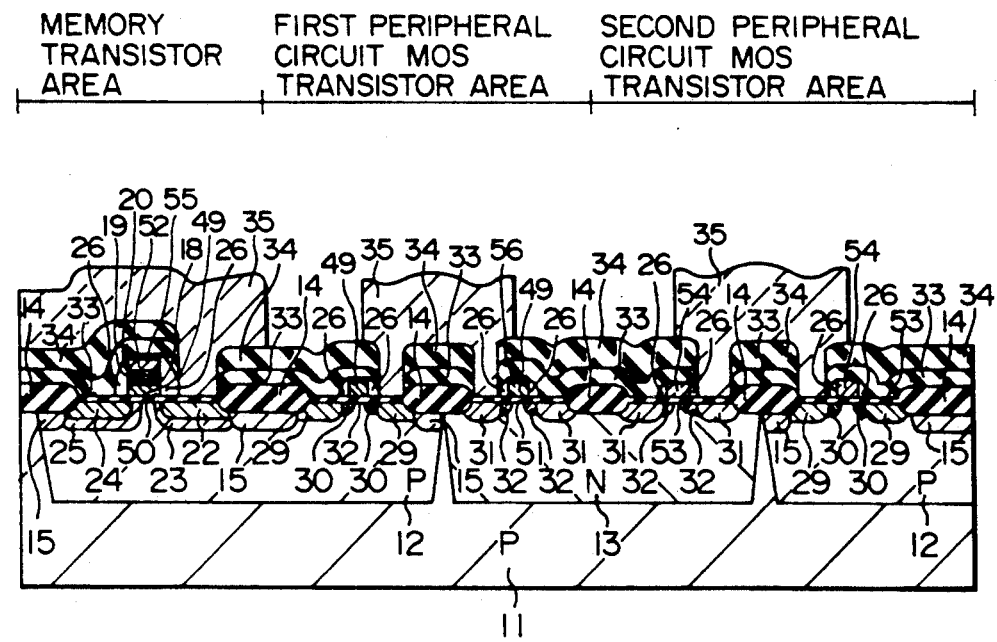

First, in FIG. 28, it is feature in construction that there are provided two types of gate oxide film of the peripheral MOS transistor (18/35 nm).

Figure 23:
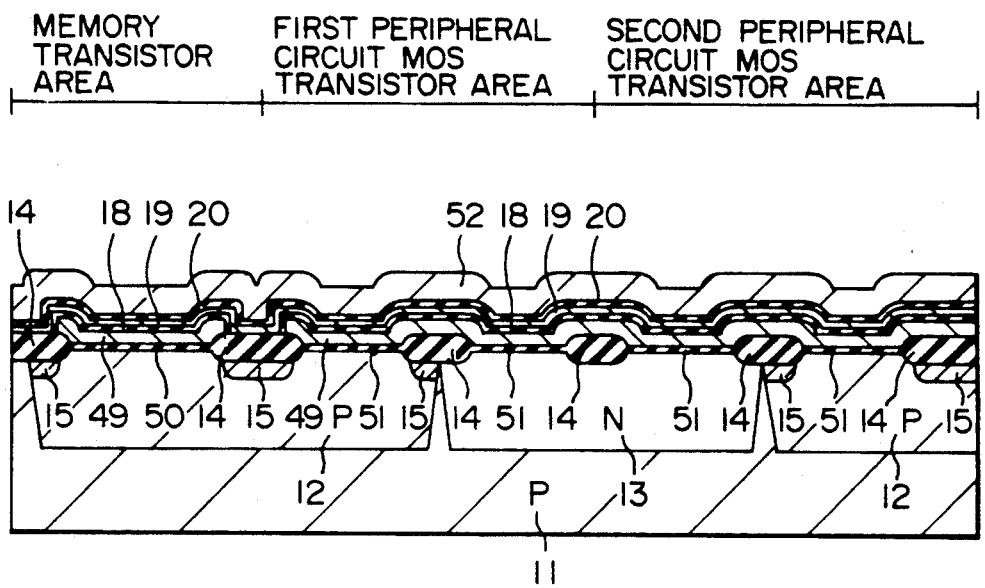

As shown in FIG. 23, in the same manner as in the above-mentioned embodiments, a p type well region 12, an n type well region 13, a field oxide film 14, and a channel stopper 15 formed of a p+ type semiconductor region for preventing the generation of a parasitic channel are formed.

Subsequently, after the surface of an active region is thermally oxidized to form a gate oxide film 51 with 30 nm thickness, the gate oxide film 51 in the memory transistor area is removed by the photoetching process. Thereafter, the surface of the active region in the memory transistor area is thermally oxidized to form a gate oxide film 50 with 10 nm thickness. At this time, the gate oxide film 51 in the first peripheral circuit MOS transistor area has a thickness of 35 nm. Subsequently, in the same manner as in the above-mentioned embodiments, a polycrystalline silicon film 49 with 200 nm thickness as a first level conductive layer is formed. In the memory transistor area, the polycrystalline silicon film 49 is then patterned so as to have a shape suitable for the formation of a floating gate electrode, and at the same time, in the first and second peripheral circuit MOS transistor areas, the polycrystalline silicon film 49 is left so as to protect the whole surface of the substrate body.

Subsequently, a composite film of silicon oxide films 18, 20, and a silicon nitride film 19 which are to be interlayer insulating films of the memory transistor, and a polysilicon film 52 with 300 nm thickness as a second level conductive layer are successively formed.

Figure 24:
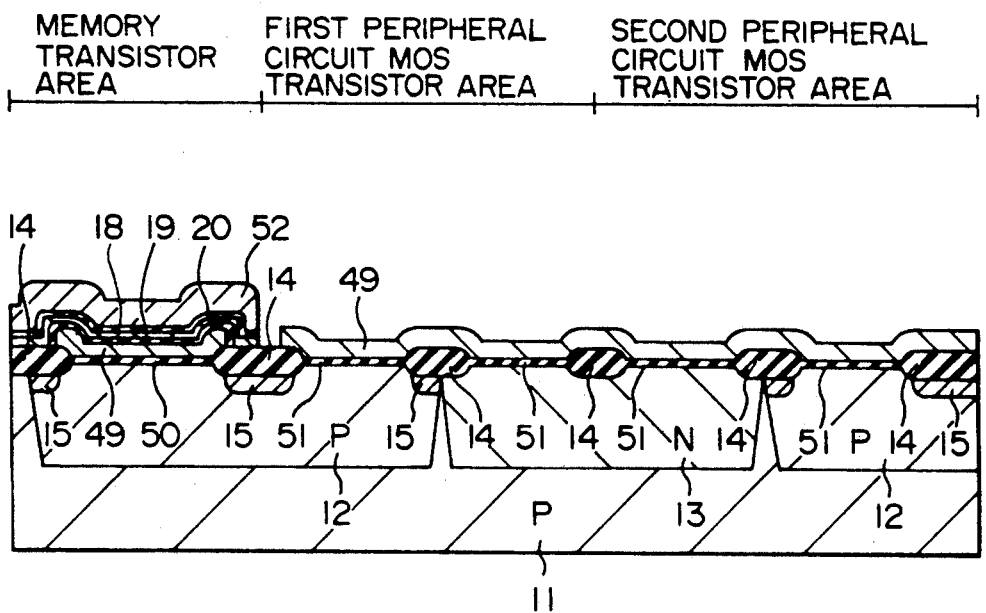

Thereafter, as shown in FIG. 24, the second level polycrystalline silicon film 52, and the interlayer insulating films 20, 19 and 18 on the first and second peripheral circuit MOS transistor areas are successively removed by the known dry etching technique.

Figure 25:
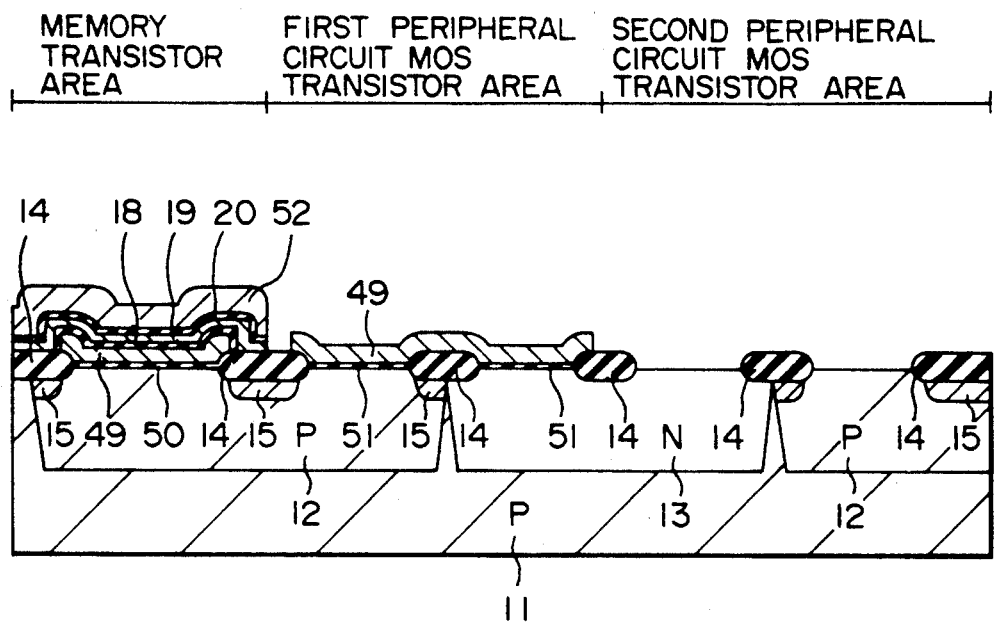

Next, as shown in FIG. 25, the first level polycrystalline silicon film 49 on the second peripheral circuit MOS transistor area is removed by the known dry etching technique. Then, the gate oxide film 51 is removed by the wet etching technique.

Figure 26:
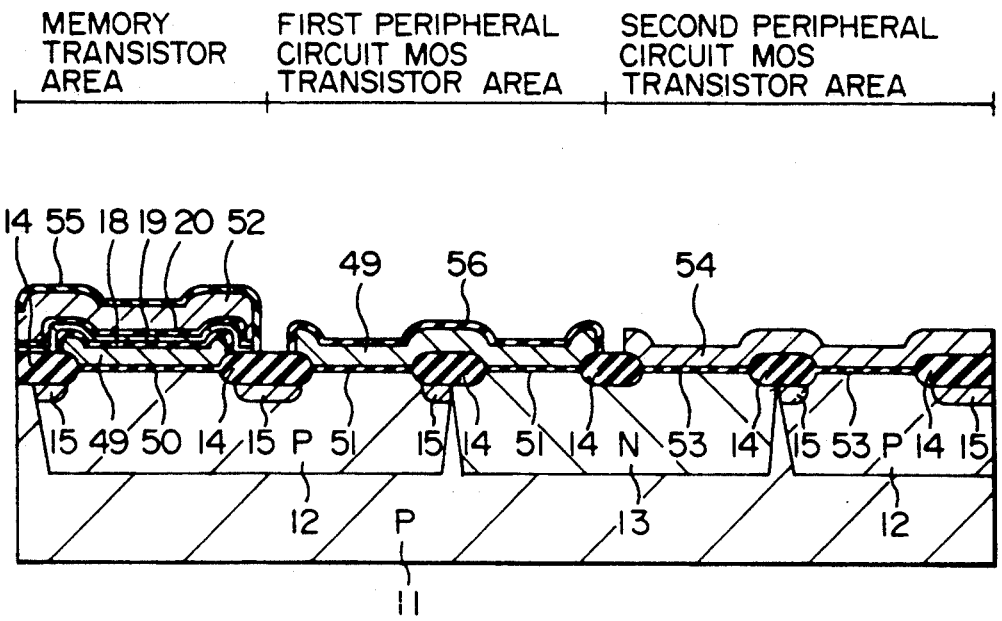

Subsequently, as shown in FIG. 26, the surface of the active region in the second peripheral circuit MOS transistor portion is again thermally oxidized to form a gate oxide film 53 with 18 nm thickness. At this time, on the polysilicon film in the memory transistor area and the first peripheral circuit MOS transistor area, oxide films 55 and 56 each having a thickness of 50 nm or so are formed, respectively. Next, a third level conductive layer (a polycrystalline silicon film, or a composite film of a metal silicide film such as a tungsten polycide film and a polycrystalline silicon film) 54 is deposited by the known chemical vapor deposition method. Thereafter, the third level conductive film 54 over the memory transistor area and the first peripheral circuit MOS transistor area is removed by the dry etching.

Figure 27:
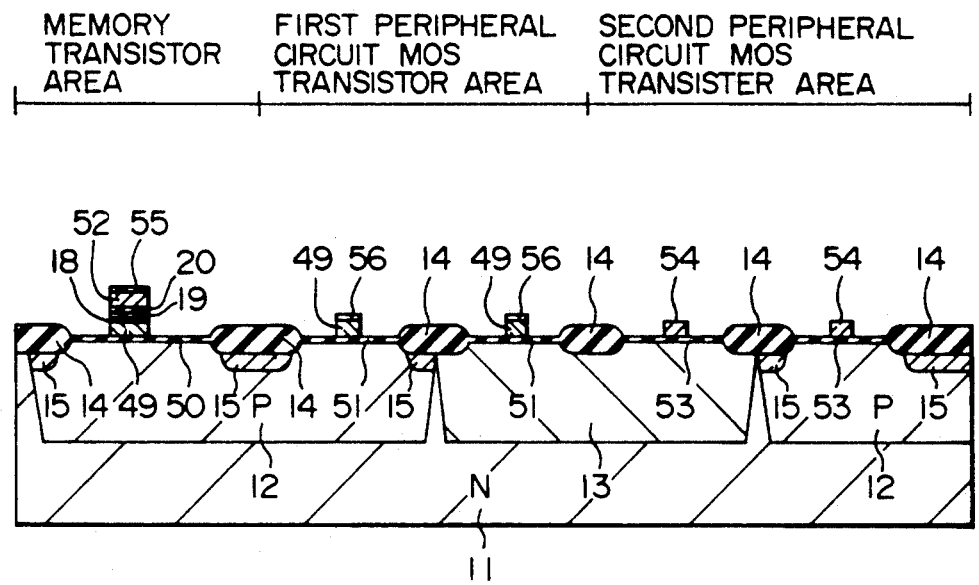

Further, as shown in FIG. 27, the polycrystalline silicon film 49 and the uppermost oxide film 50 in the first peripheral circuit MOS transistor area, and the third level conductive film 54 in the second peripheral circuit MOS transistor area are processed by the dry etching technique to form respective gate electrodes. Subsequently, a two-level gate electrode of a stack type made up of the second level polycrystalline silicon film 52, the interlayer insulating films of a three layer structure 18, 19 and 20, and the first level polycrystalline silicon film 49 is formed by the photoetching process. At this time, this multilayer film is obtained through the stack cutting by one lithography process using the anisotropic dry etching technique.

Thereafter, in the same manner as in the above-mentioned embodiments, a source region, a drain region, contact holes, and an aluminum wiring are formed. As a result, as shown in FIG. 28, there is realized a non-volatile semiconductor memory device made up of a non-volatile memory transistor, and MOS transistors for a peripheral circuit including therein two types of gate oxide film.

According to the present embodiment as described hereinabove, it is possible to set two types of gate oxide film thickness in the MOS transistors for a peripheral circuit. Thus, it is possible to use the MOS transistors for a peripheral circuit properly for a high speed operation for reading out and a high voltage drive for erasure and programming.

As set forth hereinabove, according to the present invention, it is possible to integrate a non-volatile memory transistor in which a film material having a permittivity larger than that of a silicon oxide film is applied to an interlayer insulating film, and a MOS transistor used with a peripheral circuit for driving the non-volatile memory transistor, on the same semiconductor substrate by the reliable manufacturing process. As a result, it is possible to realize a non-volatile semiconductor memory device which provides excellent performance in write, reading out and erase characteristics, without sacrificing the area of the memory cell.

What is claimed is:

1. A manufacturing method for forming a non-volatile memory transistor having a floating gate electrode and a control gate electrode, and a MOS transistor for a peripheral circuit, in a first area and a second area of the same semiconductor substrate, respectively, said manufacturing method comprising:
   a first step of forming a silicon oxide film over the first and second areas;
   a second step of forming a first conductive layer on said silicon oxide film after said first step and removing an unnecessary portion of said first conductive layer to pattern said first conductive layer on said silicon oxide film in said first area;
   a third step of forming an interlayer insulating film having a permittivity larger than that of said silicon oxide film over said first conductive layer in said first area and said silicon oxide film in said second area, after said second step; and
   another step of removing said interlayer insulating film on said silicon oxide film in said second area, and forming a second conductive layer on said interlayer insulating film in said first area, after said third step,
   wherein in said other step, prior to the removal of said interlayer insulating film on said silicon oxide film in said second area, said second conductive layer is formed on said interlayer insulating film in said first area.

2. A manufacturing method according to claim 1, wherein said first conductive layer and said second conductive layer in said first area are to form said floating gate electrode and said control gate electrode, respectively.

3. A manufacturing method according to claim 2, wherein a gate electrode of said MOS transistor for said peripheral circuit includes therein said first conductive layer formed in said second step.

4. A manufacturing method according to claim 1 or 2, wherein a part of said interlayer insulating film includes therein at least silicon nitride film.

5. A manufacturing method according to claim 3, wherein a part of said interlayer insulating film includes therein at least silicon nitride film.

6. A manufacturing method for forming a non-volatile memory transistor having a floating gate electrode and a control gate electrode, and a MOS transistor for a peripheral circuit, in a first area and a second area of the same semiconductor substrate, respectively, said manufacturing method comprising:
   a first step of forming a silicon oxide film over the first and second areas;
   a second step of forming a first conductive layer on said silicon oxide film after said first step and removing an unnecessary portion of said first conductive layer to pattern said first conductive layer on said silicon film in said first area;
   a third step of forming an interlayer insulating film having a permittivity larger than that of said silicon oxide film over said first conductive layer in said first area and said silicon oxide film in said second area, after said second step; and
   another step of removing said interlayer insulating film on said silicon oxide film in said second area, and forming a second conductive layer on said interlayer insulating film in said first area, after said third step,
   wherein in said second step, said first conductive layer is partially removed so that said first conductive layer on said second area is not removed but is left, and as a result, said interlayer insulating film is formed on said silicon oxide film in said second area through said first conductive layer in said second area by said third step, and said interlayer insulating film on said first conductive layer in said second area is removed in said other step,
   and wherein in said other step, prior to the removal of said interlayer insulating film on said silicon oxide film in said second area, said second conductive layer is formed on said interlayer insulating film in said first area.

7. A manufacturing method according to claim 6, wherein said first conductive layer and said second conductive layer in said first area are to form said floating gate electrode and said control gate electrode, respectively.

8. A manufacturing method according to claim 7, wherein a gate electrode of said MOS transistor for said peripheral circuit includes therein said first conductive layer formed in said second step.

9. A manufacturing method according to claim 6 or 7, wherein a part of said interlayer insulating film includes therein at least silicon nitride film.

10. A manufacturing method according to claim 8, wherein a part of said interlayer insulating film includes therein at least silicon nitride film.

* * * * *